United States Patent [19]

Hsu

[11] Patent Number: 5,486,982
[45] Date of Patent: Jan. 23, 1996

[54] MODULAR ELECTRONIC PACKAGING FOR COMPUTER SERVERS

[76] Inventor: Winston Hsu, 14508 Pebblewood Dr., Gaithersburg, Md. 20878

[21] Appl. No.: 258,662

[22] Filed: Jun. 10, 1994

[51] Int. Cl.⁶ .................................................. H05K 7/10
[52] U.S. Cl. .................... 361/728; 312/223.1; 361/726; 361/801; 439/341
[58] Field of Search .................. 364/708.1; 312/111, 312/236, 223.1; 211/41; 439/76, 78, 79, 377, 341, 483; 165/46; 361/689, 690, 692, 693, 704–707, 715, 716, 719, 724–726, 727–733, 736, 752, 754–759, 796, 798, 801, 802

[56] References Cited

U.S. PATENT DOCUMENTS

| | | | |
|---|---|---|---|
| 3,309,577 | 3/1967 | Roll | 317/99 |
| 4,048,669 | 9/1977 | Bowler | 361/391 |
| 4,581,495 | 4/1986 | Geri | 179/179 |
| 4,591,949 | 5/1986 | Lahr | 361/394 |
| 4,728,160 | 3/1988 | Mondor | 312/236 |
| 4,736,270 | 4/1988 | Porter | 361/801 |
| 4,748,540 | 5/1988 | Henneberg | 361/424 |
| 4,894,792 | 1/1990 | Mitchell et al. | 364/708 |
| 4,934,764 | 6/1990 | Leitermann | 312/111 |
| 4,937,771 | 6/1990 | Rumps | 364/708 |
| 4,937,806 | 6/1990 | Babson | 369/751 |
| 4,972,296 | 11/1990 | Chu | 361/391 |
| 5,107,400 | 4/1992 | Kobayashi | 361/392 |
| 5,159,533 | 10/1992 | Kuang | 361/391 |
| 5,216,579 | 6/1993 | Barasa et al. | 361/383 |
| 5,253,140 | 10/1993 | Inoue | 361/728 |
| 5,257,163 | 10/1993 | Buist | 361/729 |

FOREIGN PATENT DOCUMENTS

| | | | |
|---|---|---|---|
| 2434892 | 2/1976 | Germany . | |
| WO88/08662 | 11/1988 | WIPO | H05K 7/20 |

Primary Examiner—Gerald P. Tolin

[57] ABSTRACT

A modularized electronic system for packaging and assembling a plurality of electronic modules for building a computer server which comprises an enclosure case having a backplane assembly, at least one electronic module assembly mounted in the enclosure case, and an external case frame for mounting the enclosure case. The enclosure case comprises one lower case assembly for module mounting. The lower case assembly comprises a U-shaped holding means for holding the rear end of the module assembly and a backplane assembly for module connection. The module assembly comprises a module connector under its module head which is vertically connected to the receptacle of the backplane assembly. The rear end of the module assembly further comprises a latching means which is latched to a latch receiving means installed on the U-shaped holding means to prevent the rear end of the module assembly from moving upward. The external case frame comprises at least one case opening in its front end with a guiding means installed on both sides of the case opening and the enclosure case is slidingly mounted to the external case frame through the case opening.

32 Claims, 17 Drawing Sheets

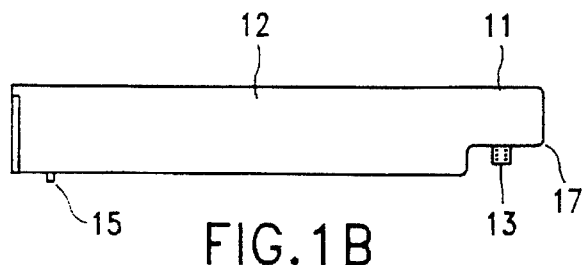
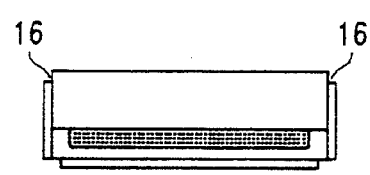
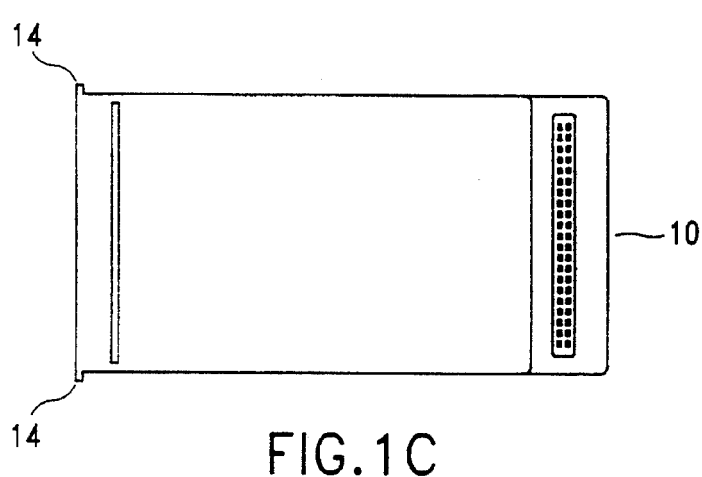
FIG.1B   FIG.1A   FIG.1C
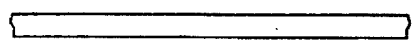
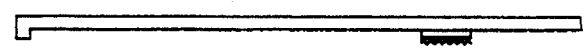
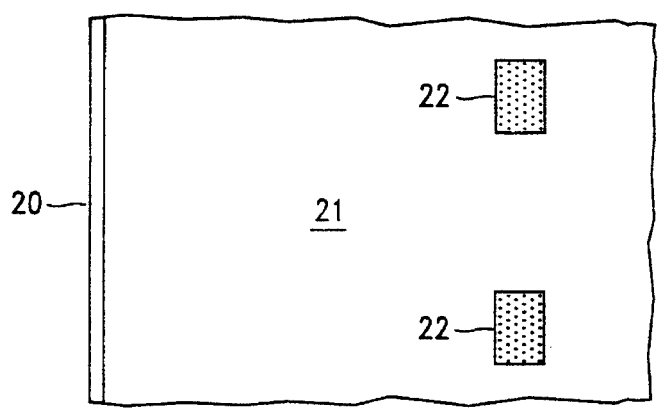
FIG.2A   FIG.2B   FIG.2C

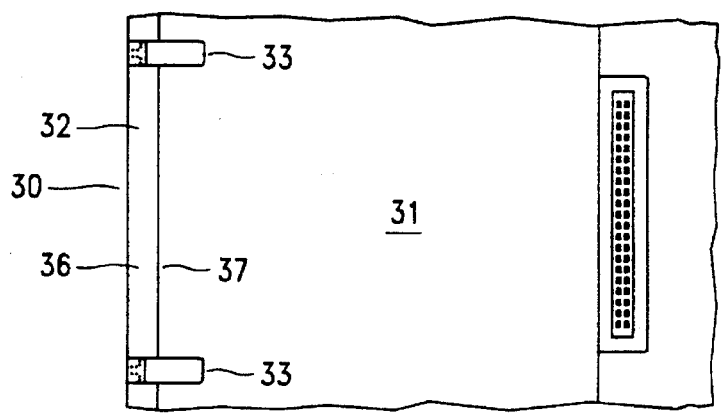
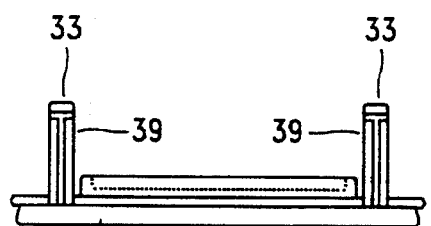 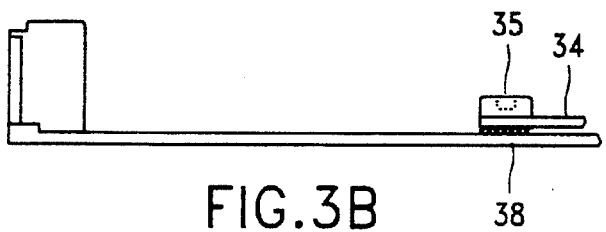
FIG.3A
FIG.3C   FIG.3B
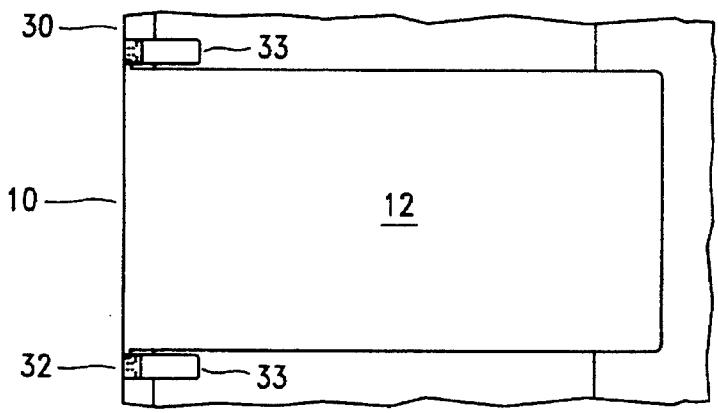
FIG.4A
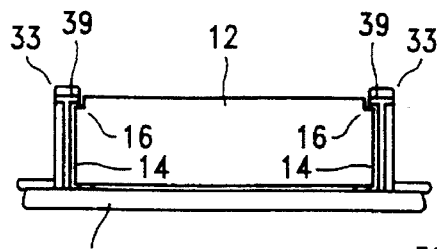 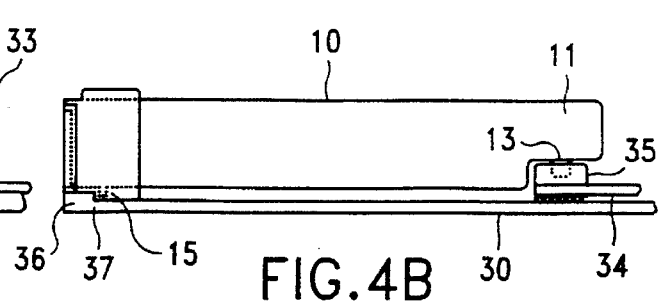
FIG.4C   FIG.4B

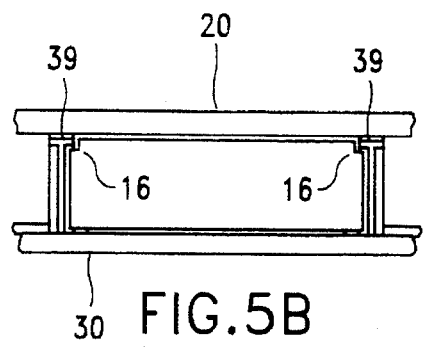
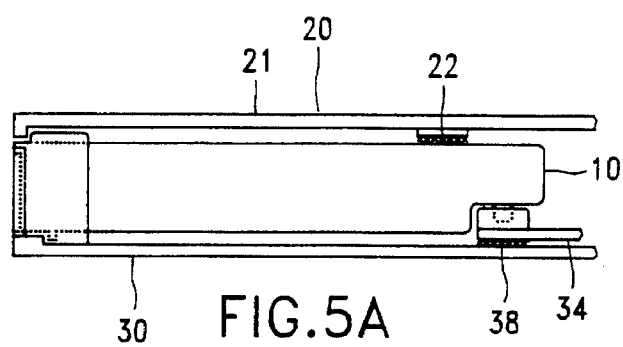
FIG.5B   FIG.5A
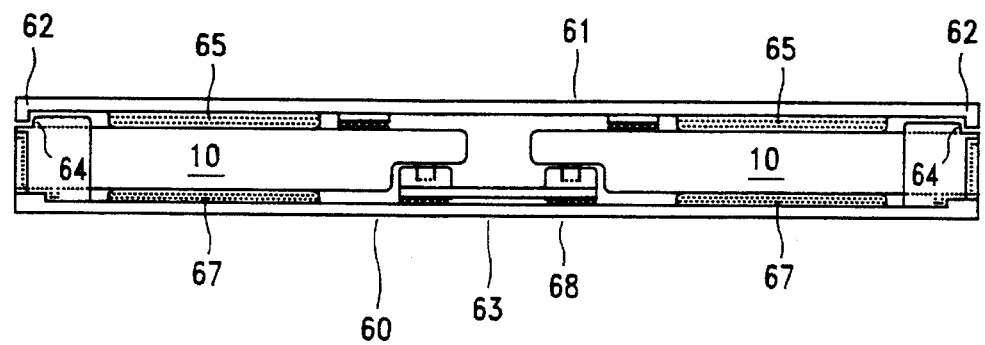
FIG.6
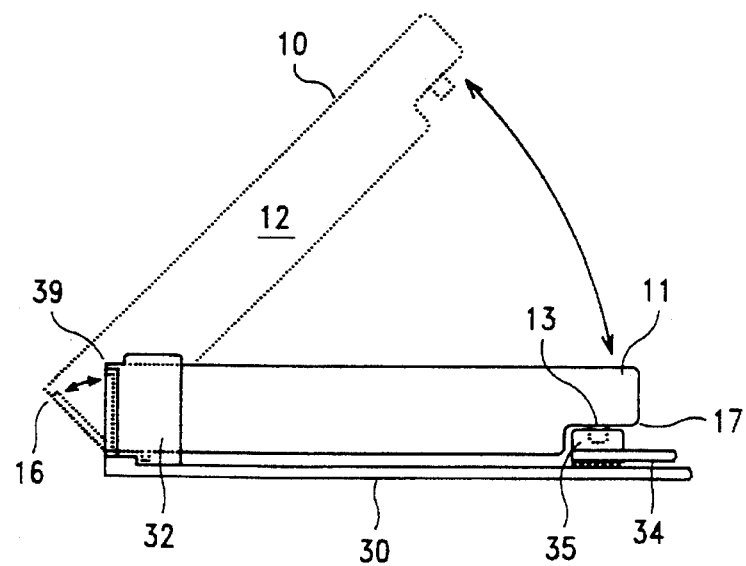
FIG.7

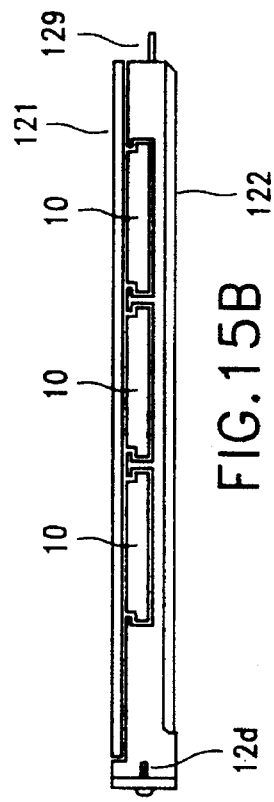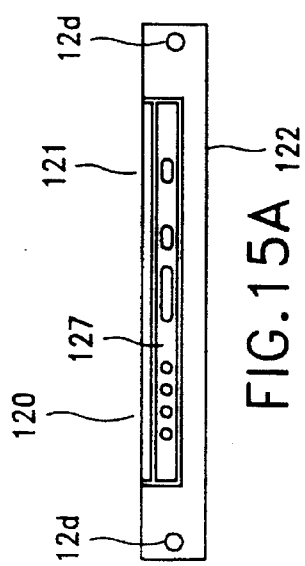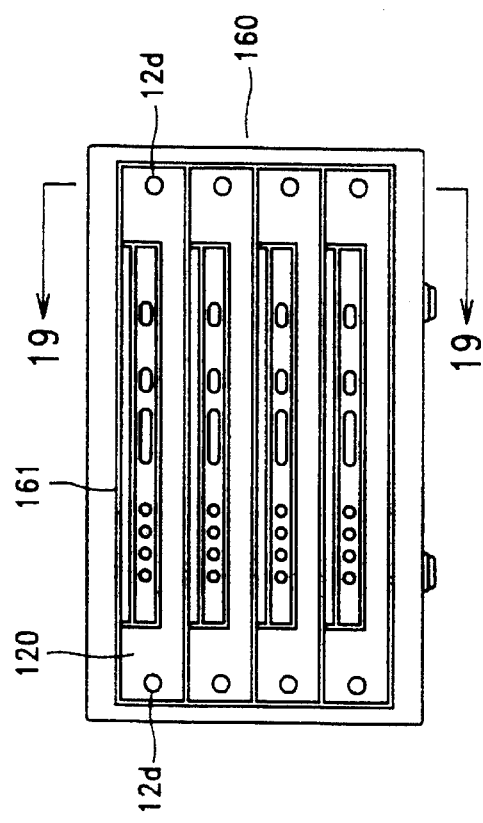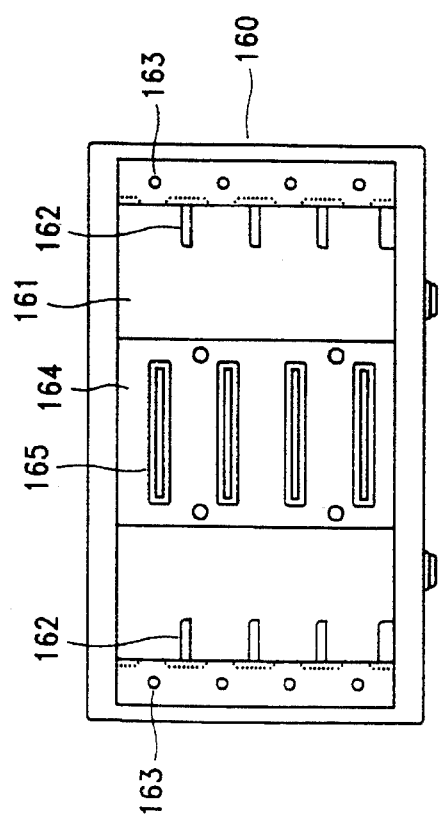
FIG.15B
FIG.15A
FIG.17
FIG.16

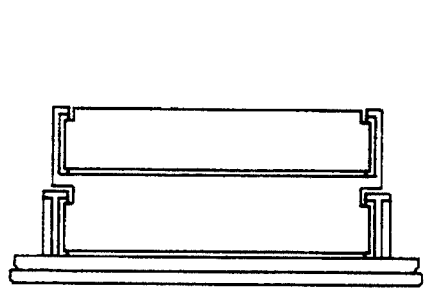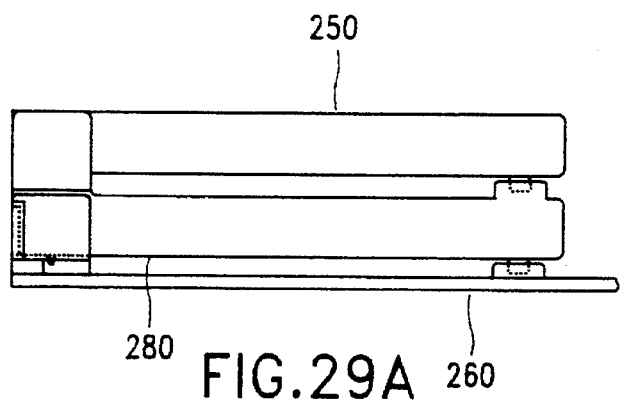
FIG.29B    FIG.29A
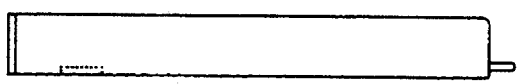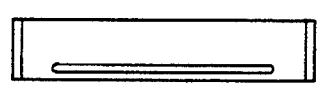
FIG.30B    FIG.30A
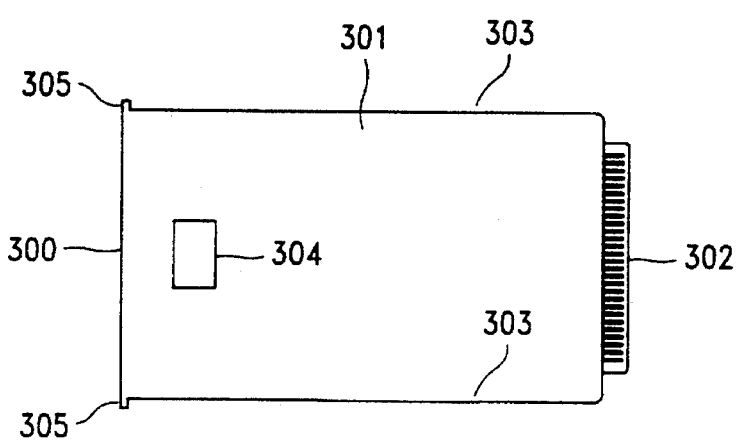
FIG.30C

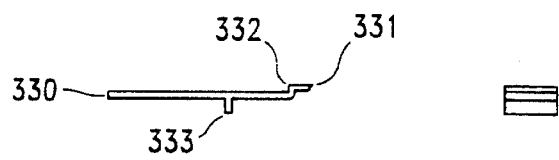
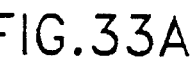
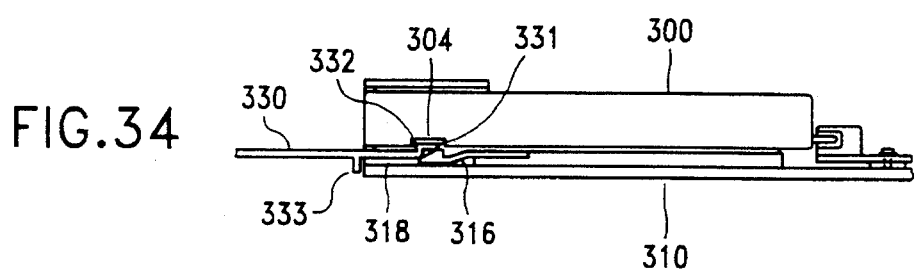
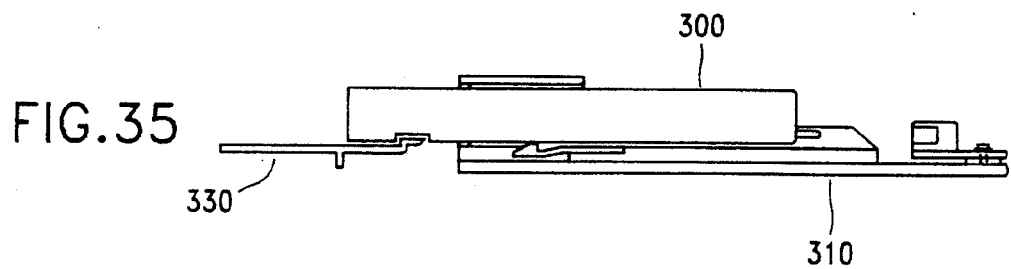
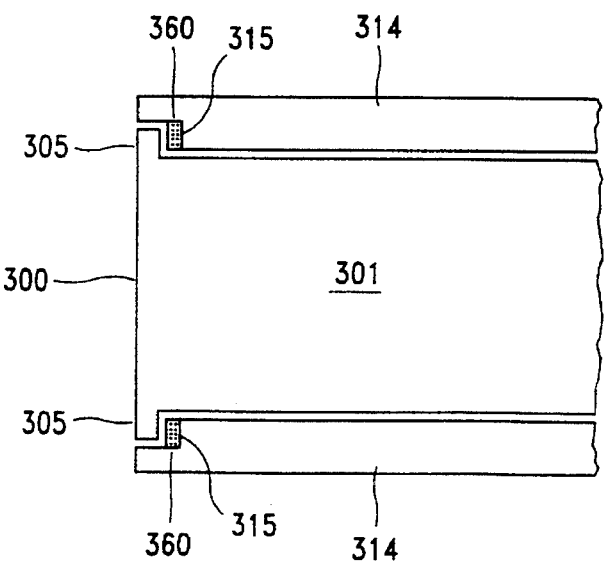

MODULAR ELECTRONIC PACKAGING FOR COMPUTER SERVERS

BACKGROUND OF THE INVENTION

1. Field of the Invention

This invention relates to both the electronic module design and the related mounting mechanism of an electronic system, and more particularly, to an electronic system comprising a plurality of electronic modules, an enclosure case and an external case frame for building a computer server.

2. Description of the Prior Art

The desktop personal computers and servers have been used for many years. Modular design are commonly used in these computers such as add-on cards, 5.25" drives and 3.5" drives. Such mechanical module standards plus the standard electronic interfaces such as ISA, EISA, PCI, IDE, SCSI, etc., have provided an open modular platform where thousands of peripheral devices have been built for the personal computer market. These readily available hardware peripherals are one of the major contributing factors which make the personal computers so popular in the past decade.

But the sizes of most electronic components are shrank rapidly because of the fast progresses in electronic technologies. And small packaging design becomes more and more popular in many electronic system designs such as portable computers or instruments. The desktop module standards become less welcome in these new applications not only because of their bulky sizes, but also the module mounting problems. Mounting an add-on card or a drive inside a big system chassis such as a desktop or server is not a problem because of the available space inside, but mounting such modules inside a very small or compact system is very difficult. Some companies have produced low profile desktops or portables by using existing desktop modules. Although some of them got some commercial successes because of the compact system sizes and also the available peripheral products for such systems, most of the systems suffered from the complex system packaging design and also difficult system assembly or module installation problems. Such packaging problems greatly limit the use of the desktop modules in small electronic systems, although their prices, performances, and the variety of the hardware solutions are the best in the personal computer market.

On the other hand, lack of proper module design for small computers such as notebooks has troubled the computer industry for a long time. The newly established PCMCIA standard provides a portable module design to solve this problem. But PCMCIA cards are external portable modules and can not be used as internal modules to simplify the complex internal packaging design problems in most portable computers. The result of such packaging problems is clearly reflected in portable computers' prices. The end users have to pay substantial premiums for their portable computers and modules while obtain less performance and capacity than the desktop counterparts. Apparently, the computer industry needs a new module design which can provide a uniform modular platform for both desktop/server and portable computers. The new module design should allow all desktop/server and portable computers be built by using the same modules. The existing desktop modules and PCMCIA cards can not achieve this goal. New module design must be devised to achieve it.

SUMMARY OF THE PRESENT INVENTION

It is therefore the goal of the present invention, by overcoming the limits of the prior art, to devise several new modules and the related mounting mechanisms to achieve the following objects:

1. Establishes new modular platform for both desktop/server and portable computers.
2. Provides new mounting mechanism designs which can solve the packaging design problems in desktop/server computers.
3. Provides a new heat dissipation design which can provide good heat dissipation capability to desktop/server computers.

Briefly, in a preferred embodiment, the present invention includes a modularized electronic system for packaging and assembling a plurality of electronic modules comprising:

1. an enclosure case having at lease one lower case assembly with a lower horizontal panel in it for module loading; the lower panel of the lower case assembly comprises at least one U-shaped holding means having two vertical planner panels on its left- and right-hand sides;
2. an electronic backplane assembly having at least one receptacle and the backplane assembly is removably mounted to the lower case assembly for module connection;
3. at least one electronic module assembly having a module head in its front end and a substantially rectangular module body behind the module head; the module head comprises a module connector on its bottom wherein the module connector of the module head is vertically plugged in and latched to the receptacle of the backplane assembly in a removable manner, and the left- and right-hand sides of the rear end of the module body engage and removably attach to the two vertical planner panels of the U-shaped holding means of the lower case assembly whereby the module assembly is reliably mounted to the lower case assembly by having its front end mounted to the receptacle of the backplane assembly and its rear end mounted to the U-shaped holding means;

the rear end of the module body further comprises a latching means and the rear end of the U-shaped holding means further comprises a correspondent latch receiving means wherein the latching means of the module body engages and removably attaches to the latch receiving means of the U-shaped holding means to prevent the rear end of the module body from moving upward after the module assembly is mounted to the lower case assembly.

It is an advantage of the present invention that it can be used as a new modular platform for both desktop/server and portable computers so that the computer users can use the same modules in all their portable and desktop/server systems. It is another advantage that the present invention provides a new mounting mechanism which greatly simplifies the packaging design of the desktop/server computers and also allows easy assembly by hands. It is another advantage that the present invention allows easy system configuration or reconfiguration so that the computer users can easily configure a desktop/server or a portable system according to their needs.

These and other objects and the advantages of the present invention will no doubt become obvious to those of ordinary skill in the art after having read the following detailed description of the preferred embodiment which is illustrated in the various figures and drawings.

BRIEF DESCRIPTION OF THE DRAWINGS

FIGS. 1A–1C are the front, side and bottom views of a module assembly according to the present invention;

FIGS. 2A–2C are the rear, side and bottom views of part of a upper case assembly according to the present invention;

FIGS. 3A–3C are the top, side and rear views of part of a lower case assembly according to the present invention;

FIGS. 4A–4C are the top, side and rear views of the module assembly mounted to the lower case assembly;

FIGS. 5A–5B are the side and rear views of the module assembly clamped between the upper and lower case assemblies;

FIG. 6 is the cross section view of the upper assembly and the lower case assembly attached together with two module assemblies clamped in between.

FIG. 7 shows the side view of the module assembly which is being mounted to or removed from the lower case assembly;

FIG. 14 is the perspective view of the enclosure case which shows the upper and lower case assemblies are attached together with module assemblies clamped in between;

FIGS. 15A–15B are the front and side views of the enclosure case;

FIG. 16 is the front view of an empty external case frame;

FIG. 17 is the front view of the loaded external case frame;

FIGS. 29A–29B are the side and rear views of two module assemblies stacked together on the backplane assembly;

FIGS. 30A–30C are the front, side, and bottom views of a module assembly with a horizontal module connector on its front end;

FIGS. 33A–33C are the front, side, and bottom views of a module unlatching means according to the present invention;

FIG. 34 is a side section view which shows that the module unlatching means has unlatched the latching means of the module guide assembly and is ready to pull the module assembly out;

FIG. 35 is a side section view which shows that the module assembly has been pulled out from the module guide assembly by using the module unlatching means;

FIG. 36 is the cross section view 36—36 of the rear view in FIG. 32 which shows the rear part of the module body mounted to the module guide assembly which has two elastic means;

DETAILED DESCRIPTION OF THE PREFERRED EMBODIMENT

Figure 8A:
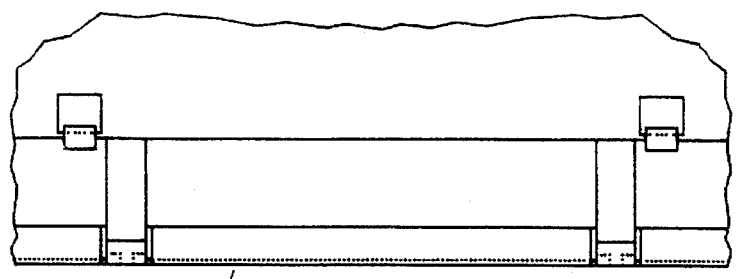
FIGS. 8A–8C are the top, front and side views of part of a lower case assembly having a removable U-shaped holding means installed in it.

FIGS. 1A–1C are the front, side and bottom views of an electronic module assembly 10 according to the present invention. The module assembly 10 comprises a module head 11 in its front end and a substantially rectangular module body 12 behind the module head 11. The module head 11 comprises a module connector 13 on its bottom and a front protruding edge 17 on its front end for module removal. The rear end of the module body 12 further comprises two protruding edges 14 on its left and right sides, and a bottom protruding edge 15 on its bottom side. The module connector 13 of the module head 11 is positioned higher than the bottom of the module body 12 wherein the module connector 13 will not be touched when the module assembly 10 is placed on a planner surface outside the modularized electronic system whereby the module connector 13 can easily be kept clean and avoid possible damage. The rear end of the module body 12 further comprises a latching means 16 on top of the two protruding edges 15 and the latching means 16 will be attached to the latch receiving means 39 of the lower case assembly 30 (shown in FIG. 3)

to prevent the rear end of the module body 12 from moving upward. This feature will be explained in the rear view of FIG. 4. The module assembly 10 will be mounted in an enclosure case which comprises a lower case assembly 30 for module loading and a upper case assembly 20 for module clamping. The construction of the upper case assembly 20 and the lower case assembly 30 will be illustrated in FIGS. 2A–2C and FIGS. 3A–3C.

FIGS. 2A–2C are the rear, side and bottom views of part of a upper case assembly 20 according to the present invention. The upper case assembly 20 comprises a upper horizontal panel 21 of the enclosure case for module clamping and at least one cushion means 22 on the module contacting part for vibration absorption and shock protection purposes.

FIGS. 3A–3C are the top, side and rear views of part of a lower case assembly 30 according to the present invention. The lower case assembly comprises a lower horizontal panel 31 of the enclosure case, a U-shaped holding means 32 having two vertical planner panels 33 on its left- and right-hand sides, and an electronic backplane assembly 34 having at least one receptacle 35 for module connection. The U-shaped holding means 32 of the lower case assembly 30 further comprises a bottom panel 36 with a receiving edge 37 on it for engaging the bottom protruding edge 15 of the module assembly 10. The lower panel 31 of the lower case assembly 30 further comprises at least one cushion means 38 under the backplane assembly 34 for vibration absorption and shock protection purposes. The rear end of the U-shaped holding means 32 further comprises a latch receiving means 39 on top of the two vertical planner panels 33 for latching the latching means 16 on the rear end of the module body 12. This feature will be explained in the rear view of FIGS. 4A–4C.

FIGS. 4A–4C are the top, side and rear views of the module assembly 10 mounted to the lower case assembly 30. If there is an I/O port installed on the rear end of the module assembly 10, forces from various directions will be exerted on the rear end of the module assembly 10 when connecting the I/O port. If the module assembly and the lower case assembly can not resist such forces, the front end connector 13, backplane assembly 34, and even the whole system may be damaged. Several features are designed to resist such forces. The top view shows that the left- and right-hand sides of the rear end of the module body engage and removably attach to the two vertical planner panels 33 of the U-shaped holding means 32 of the lower case assembly 30. These two vertical planner panels 33 make sure that the rear end of the module body 12 will not move in left or right directions. The side view shows that the bottom protruding edge 15 (shown in dash line) of the module body 12 engages and outwardly attaches to the receiving edge 37 of the bottom panel 36 to resist external pulling forces exerted on the rear end of the module body 12. It also shows that the module connector 13 of the module head 11 is vertically plugged in and latched to the receptacle 35 of the backplane assembly 34 in a removable manner. The rear view shows that the two protruding edges 14 of the module body 12 engage and inwardly attach to the rear ends of the two vertical planner panels 33 of the U-shaped holding means 32 to resist external pushing forces exerted on the rear end of the module body 12. It also shows that the latching means 16 of the module body 12 engages and removably attaches to the latch receiving means 39 of the U-shaped holding means 32 to prevent the rear end of the module body 12 from moving upward after the module assembly 10 is mounted to the lower case assembly 30. The module assembly 10 is reliably mounted to the lower case assembly 30 by having its front end mounted to the receptacle 35 of the backplane assembly 34 and its rear end mounted to the U-shaped holding means 32.

These features shown in FIG. 4A–4C make sure that the rear end of the module body 12 is reliably latched to the lower case assembly 30 for possible I/O connecting operations over the rear end of the module body 12. In fact, the module assembly 10 is designed like a "buckle" which is tightly latched to the lower case assembly 30. This "module buckle" can only be removed by pulling up the module head 11 which will be illustrated in FIG. 7, and it is very difficult to move this "module buckle" from its rear end. As long as the module head 11 is latched to the receptacle 35 of the backplane assembly 34, there is almost no need to use other mechanisms to keep the module assembly mounted to the lower case assembly. But a upper case assembly which can work together with the lower case assembly to clamp the module assembly in between definitely will make the module mounting more reliable, especially in a harsh environment. FIGS. 5A–5B will illustrate such design.

FIGS. 5A–5B are the side and rear views of the module assembly clamped between the upper and lower case assemblies. It shows that the upper panel 21 of the upper case assembly 20 engages and removably attaches to the upper end of the module assembly 10 when the enclosure case is closed whereby the module assembly 10 is more reliably mounted to the lower case assembly 30 by the help of the upper case assembly 20. The cushion means 22 is installed on the module contacting part to absorb shocks or vibrations so that the module assembly 10 can be protected by the cushion means 22 of the upper case assembly 20 in a harsh environment. Also the cushion means 38 is installed under the backplane assembly 34 for vibration absorption and shock protection so that the backplane assembly 34 and the module assembly 10 can be protected by the cushion means 38 of the lower case assembly 30 in a harsh environment. In FIGS. 5A–5B the importance of the latching means 16 and the latch receiving means 39 can easily be seen. If this latching mechanism is not installed, other mechanisms such as fastening means (screws) or latching means must be installed between the upper and lower case assemblies to make sure that the rear end of the module body will not pop out of the U-shaped holding means when a user is connecting an I/O cable to the rear end of the module body.

FIG. 6 is the cross section view of the upper assembly 61 and the lower case assembly 63 attached together with two module assemblies 10 clamped in between. The upper case assembly 61 comprises an assembly attachment means 62 over two corners and the lower case assembly 63 further comprises an assembly attachment means 64 wherein the assembly attachment means 62 of the upper case assembly 61 engages and removably attaches to the assembly attachment means 64 of the lower case assembly 63.

The upper case assembly 61 further comprises two heat sinks 65 mounted under the upper panel 66 and the upper case assembly 61 also comprises heat conductive material in its case body for heat conductance wherein the heat sinks 65 of the upper case assembly 61 engage and removably attach to the upper ends of the two module assemblies 10 whereby the upper case assembly 61 can be used as a heat sink to dissipate heat generated from the module assemblies 10.

The lower case assembly 63 further comprises two heat sinks 67 mounted on the lower panel 68 and the lower case assembly 63 also comprises heat conductive material in its case body for heat conductance wherein the heat sinks 67 of the lower case assembly 63 engage and removably attach to the lower end of the two module assemblies 10 whereby the lower case assembly 63 can be used as a heat sink to dissipate heat generated from the module assemblies 10.

Figure 12:
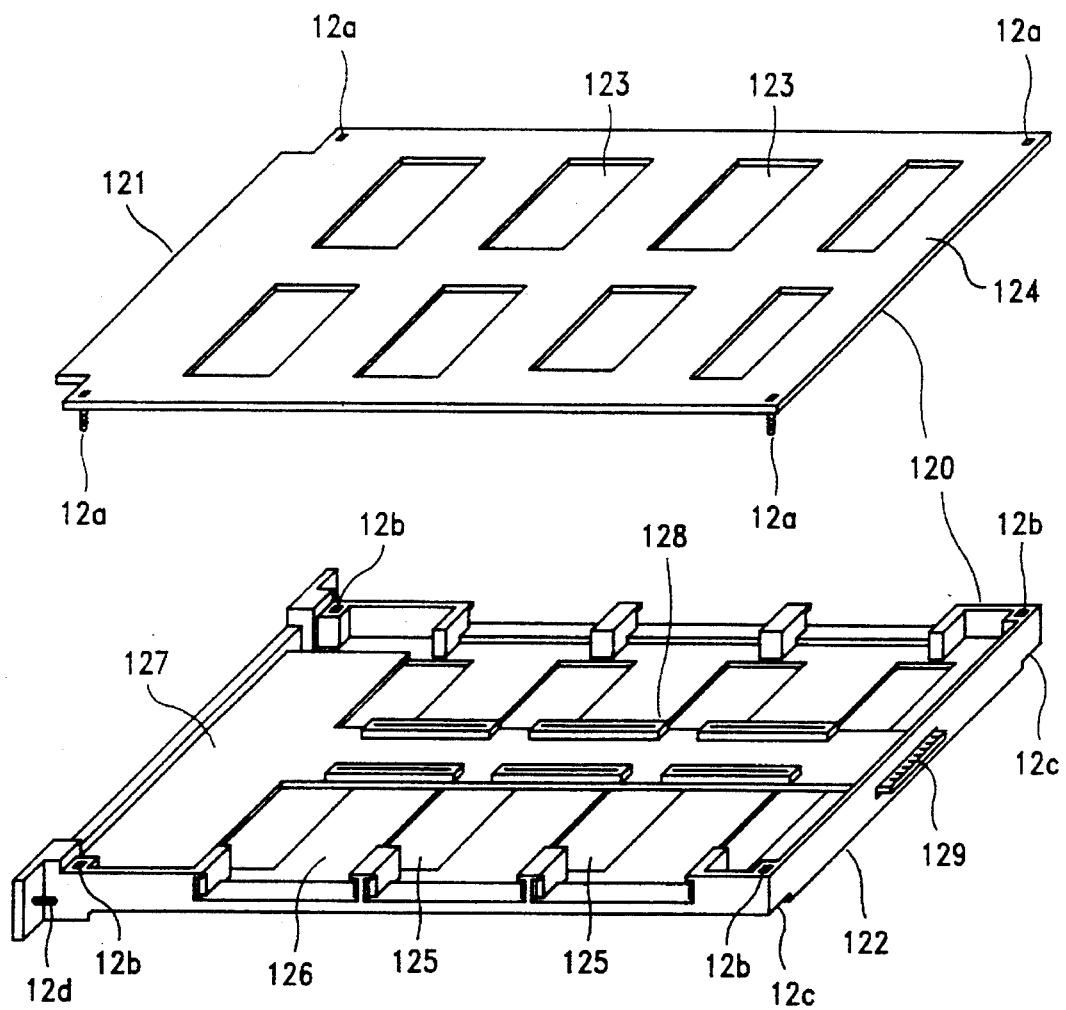
FIG. 12 is the explosive perspective view of a upper and lower case assemblies equipped with air ventilation holes.

The heat sink design is very important for desktop/server systems. When more and more electronic components are shrank into a small module, and six or eight such modules are packed inside a very compact enclosure case, heat dissipating capability is really a big concern in such compact system design. Air cooling by electrical fans is sometimes not available because of power restriction. And it is also difficult to cover the whole system only by air cooling because of the limited internal space inside such compact systems for air ventilation. Conductive cooling design such as the heat sinks 65 and 67 attached directly to the enclosure case provides a very effective cooling mechanism to all the modules mounted inside while waste no space. The heat sinks depicted in FIG. 6 can be a liquid heat sink which is a flexible bag filled with liquid conductive material in it such as FLUORINERT. The heat sink is mounted to the upper or lower case assembly by applying heat conductive tape on the contacting side. The whole enclosure case is used both as a module supporting structure and also heat dissipation mechanism. Air cooling can also be provided to such enclosure case equipped with heat sinks. FIG. 12 provides an example for such air cooling design.

FIG. 7 shows the side view of the module assembly 10 which is being mounted to or removed from the lower case assembly 30. It show that the module assembly 10 further comprises a front protruding edge 17 on its front end for module removal wherein the module assembly 10 can be removed from the lower case assembly 30 by pulling the front protruding edge 17 up to detach the module connector 13 of the module head 11 from the receptacle 35 of the backplane assembly 34 first and then pulling the module head 11 backward to remove the rear end of the module body 12 from the U-shaped holding means 32 of the lower case assembly 30. FIG. 7 also shows how the latching means 16 of the module body 12 engage the latch receiving means 39 of the U-shaped holding means 32.

Figure 8B:
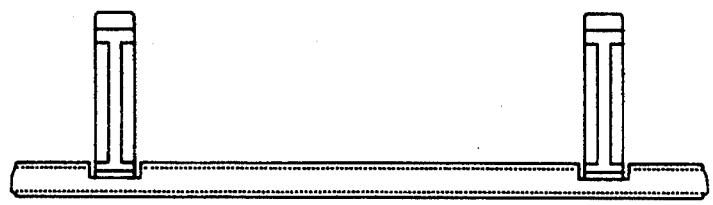
Figure 8C:
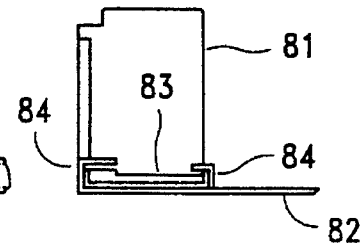

Sheet metal material is commonly used to build enclosure cases for many electronic systems. In building an enclosure case for a desktop/server system, however, it is usually difficult to build a compact U-shaped holding means by using sheet metal material. If such U-shaped holding means can be built as a plastic piece, it will greatly simplifies the sheet metal work. FIGS. 8A–8C presents such an example.

FIGS. 8A–8C are the top, front and side views of part of a lower case assembly 80 having a removable U-shaped holding means 81 installed in it. The U-shaped holding means 81 of the lower panel 82 is made as a removable assembly having an assembly attachment means 83 and the lower panel 82 of the lower case assembly 80 further comprises a correspondent assembly attachment means 84 wherein the assembly attachment means 83 of the U-shaped holding means 81 engages and securely attaches to the assembly attachment means 84 of the lower panel 82 whereby the U-shaped holding means 81 of the lower panel 82 can be changed without hard tooling modification to the lower case assembly 80.

Figure 9A:
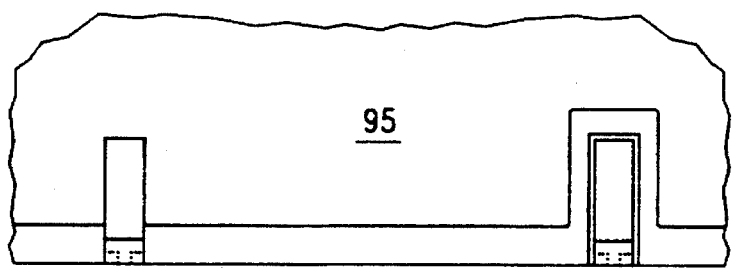
FIGS. 9A–9C are the top, front and side views of part of a lower case assembly having a removable vertical planner panel installed in it.
Figure 9B:
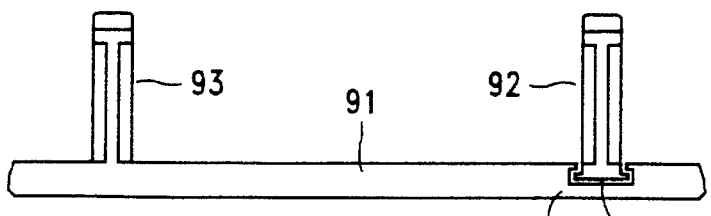
Figure 9C:
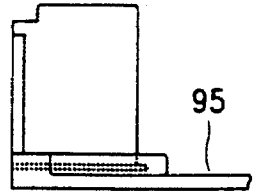

In small module form factor design, it is usually difficult to require all the modules follow the same form factor. And it is quite unrealistic to request a module used in palmtop computers to have the same form factor as a server module. In order to build a general purpose mounting mechanism which can tolerate various module form factors, some flexible module mounting mechanisms must be provided for such purpose. The module form factor variations can be classified into three categories: width, height and length. I/O modules with different lengths can usually be fixed by attaching an adapter on the rear end of a short module, and this will not be discussed here. Two methods are devised to cover the variations in module width and module height. FIGS. 9A–9C present a removable vertical planner panel design for modules with different widths, and FIGS. 10A and 10C and FIGS. 11A–11B present a mounting kit design for mounting a small module in a higher enclosure case.

FIGS. 9A–9C are the top, front and side views of part of a lower case assembly 90 having a removable vertical planner panel 92 installed in it. It shows that the U-shaped holding means 91 comprises a removable vertical planner panel 92 and a fixed vertical planner panel 93. The removable vertical planner panel 92 has an assembly attachment means 94 on its lower end. The lower panel 95 of the lower case assembly 90 further comprises a correspondent assembly attachment means 96 wherein the assembly attachment means 94 of the removable vertical planner panel 92 engages and removably attaches to the assembly attachment means 96 of the lower panel 95 whereby the removable vertical planner panel 92 can easily be changed.

Figure 10A:
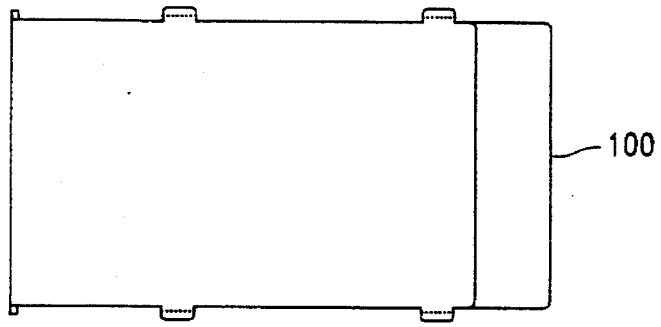
FIGS. 10A–10C are the top, side and front views of a base module assembly with a mounting kit assembly attached on top of it.
Figure 10B:
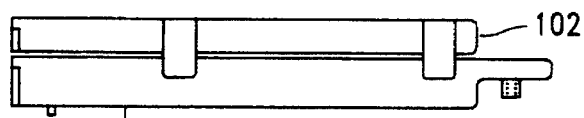
Figure 10C:
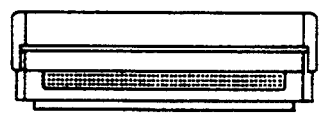
Figures 11A, 11B:
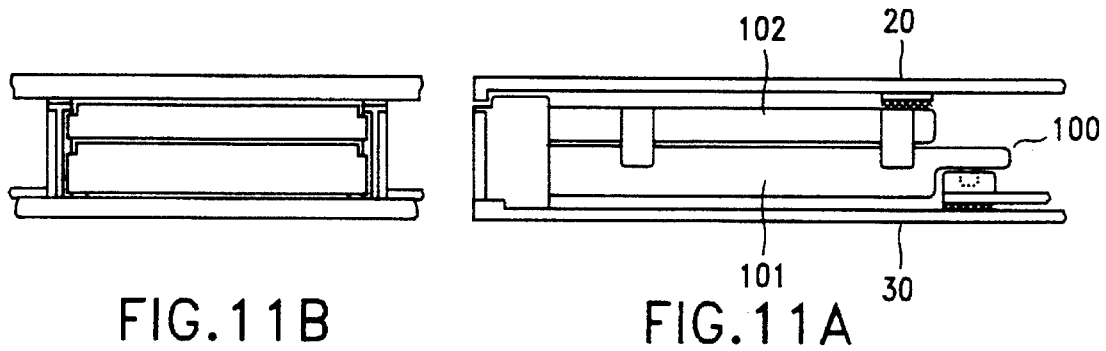
FIGS. 11A–11B are the side and rear views of the base module assembly attached with the mounting kit assembly clamped between the upper and lower case assemblies.

FIGS. 10A–10C are the top, side and front views of a module assembly 100 which comprises a base module assembly 101 on its lower end and at least one mounting kit assembly 102 attached on top of the base module assembly 101. FIGS. 11A–11B are the side and rear views of the base module assembly 101 attached with the mounting kit assembly 102 clamped between the upper and lower case assemblies 20 and 30. This design allows a small module such as the base module 101 be easily mounted in a higher enclosure case by attaching a mounting kit assembly on its top.

Figure 13:
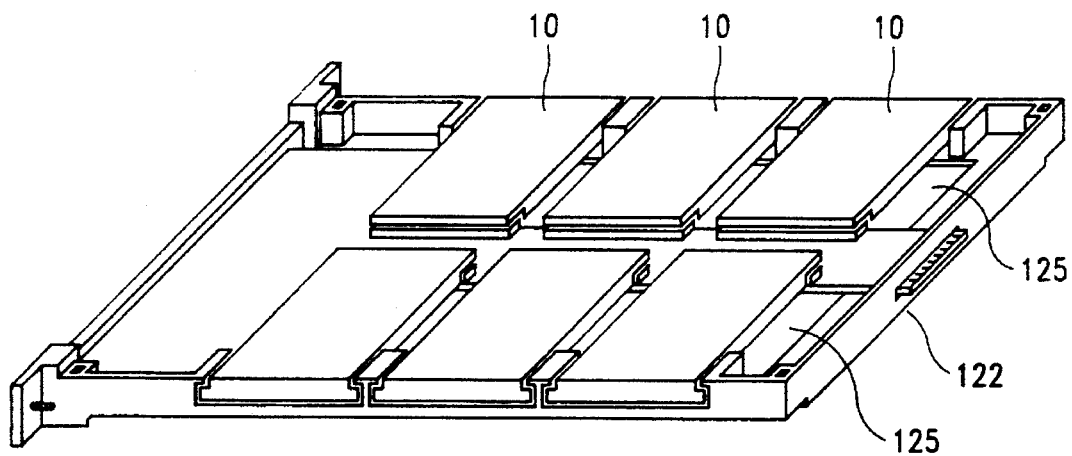
FIG. 13 is the perspective view of the lower case assembly loaded with six module assemblies.
Figure 14:
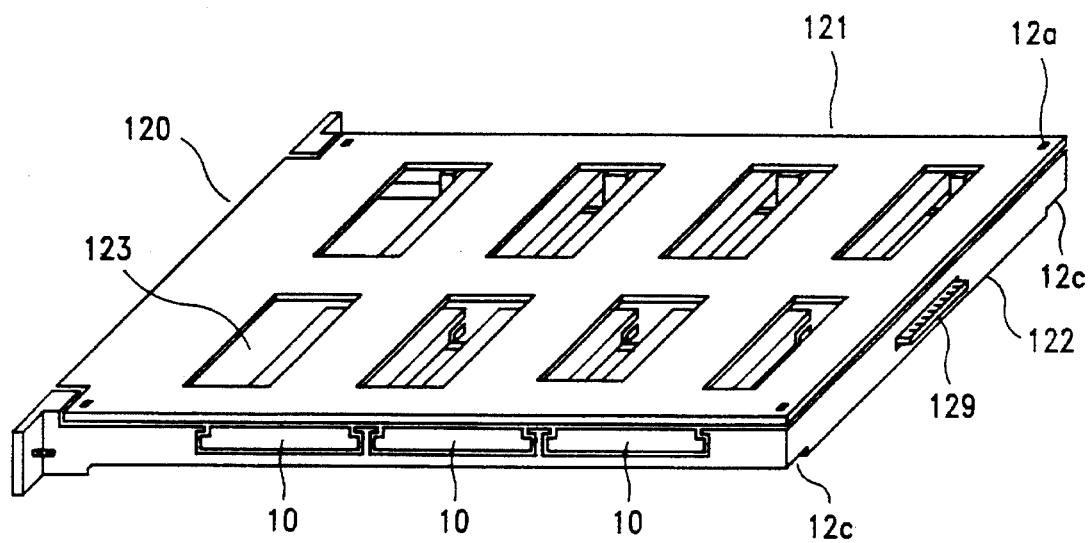
Figure 20:
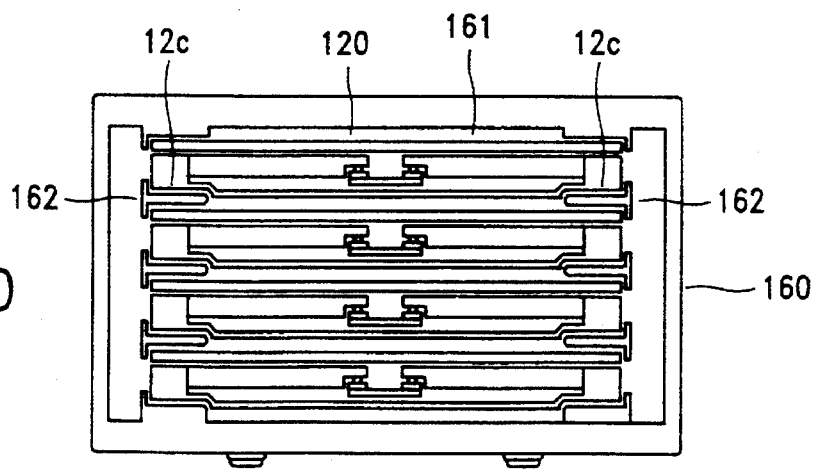
FIG. 20 is the cross section view 20—20 of FIG. 18 which shows the internal construction of the loaded external case frame.

The above diagrams illustrate how a single module is mounted in an enclosure case, and the following diagrams will show how will multiple modules be configured in a single enclosure case, and also how to build a compact server by using multiple enclosure cases. FIG. 12 to FIG. 14 presents a configuration of a single enclosure case which requires both upper and lower case assemblies. FIGS. 15A–15B to FIG. 20 show a compact server design which can take four enclosure cases in it.

FIG. 12 is the explosive perspective view of an enclosure case 120 which has a upper case assembly 121 and lower case assembly 122 equipped with air ventilation holes. The upper case assembly 121 comprises eight air ventilation openings 123 on the upper panel 124 whereby air ventilation can be created inside the enclosure case through the air ventilation openings 123. The lower case assembly 122 further comprises eight air ventilation openings 125 on the lower panel 126 whereby air ventilation can be created inside the enclosure case through the air ventilation openings 125. The backplane assembly 127 is removably mounted to the lower case assembly 122. It comprises six receptacles 128 for module connections and also a backplane connector 129 for connecting the system backplane 164 of the external case frame 160 which will be shown on FIG. 16.

The upper case assembly 121 has an assembly attachment means 12a (screws) installed on its corners and the lower case assembly 122 also has an assembly attachment means 12b installed on its corners (screw receiving holes) and FIG. 14 will show how the upper and lower cases 121 and 122 are attached together. The lower case assembly 122 comprises a sliding means 12c on two opposite sides of the case body. The lower case assembly 122 further comprises a latch receiving means 12d on two correspondent sides of the case body which will latch the case latching means 163 of the external case frame 160 after the enclosure case 120 is mounted to the external case 160.

FIG. 13 is the perspective view of the lower case assembly 122 loaded with six module assemblies 10. It shows that how the module assemblies 10 are arranged in the lower case assembly 122. The air ventilation holes 125 of the lower case assembly 122 are located under these modules for air cooling.

FIG. 14 is the perspective view of the enclosure case 120 with the module assemblies 10 clamped between the upper case assembly 121 and lower case assembly 122. The assembly attachment means 12a of the upper case assembly 121 engages and removably attaches to the assembly attachment means 12b (not shown) of the lower case assembly 122. The enclosure case 120 has a substantially rectangular case body with a sliding means 12c on two opposite sides of the case body and the enclosure case 120 will be slid into the external case frame 160 by using the sliding means 12c and this will be illustrated from FIG. 16 to FIG. 20. The air ventilation holes 123 are located above the module assemblies 10 for air cooling.

FIGS. 15A–15B are the front and side views of the enclosure case 120. The front view of the enclosure case 120 shows that the front end of the backplane assembly 127, the lower case assembly 122 with two latching receiving means 12d on both sides, and the upper case assembly 121 attached on top of the backplane assembly 127. The side view of the enclosure case shows that the module assemblies 10 are clamped between the upper case assembly 121 and the lower case assembly 122. The backplane connector 129 of the backplane assembly 127 are protruded outside the lower case assembly 122. It also shows the side view of the latch receiving means 12d which is a screw.

FIG. 16 is the front view of an empty external case frame 160 which comprises at least one case opening 161 on its front side and a guiding means 162 along the left- and right-hand sides of the case opening 161 for housing the enclosure case 120. It also comprises a case latching means 163 on the left- and right-hand sides of the case opening 161, and a system backplane 164 having four receptacles 165. The system backplane 164 is removably mounted to the inner side of the case opening 161.

Figure 18:
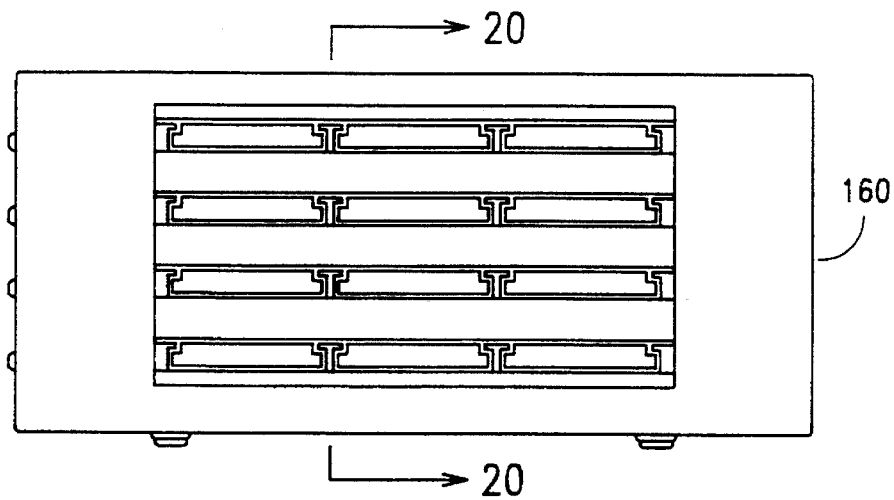
FIG. 18 is the side view of the loaded external case frame.

FIG. 17 is the front view of the external case frame 160 with four enclosure cases 120 loaded in it and FIG. 18 is the side view of the loaded external case frame 160. FIG. 17 shows that the latch receiving means 12d of the enclosure cases 120 engage and removably latch the case latching means 163 (not shown) of the external case frame 160 after the enclosure cases 120 are mounted to the external case frame 160 to prevent them from sliding out of the case opening 161.

Figure 19:
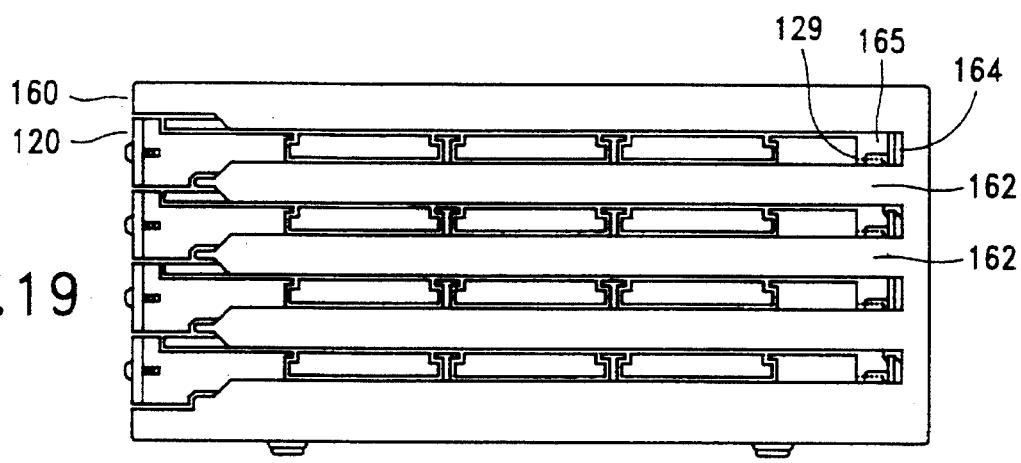
FIG. 19 is the side section view 19—19 of FIG. 17 which shows the loaded external case frame with no side panel installed.

FIG. 19 is the side section view 19—19 of FIG. 17 which shows the loaded external case frame 160 with no side panel installed. The backplane connector 129 of the enclosure case 120 engages and horizontally attaches to the receptacle 165 of the system backplane 164 of the external case frame 160 after the enclosure case 120 is mounted to the external case frame 160 whereby a plurality of the enclosure cases 120 can be horizontally mounted to an external case frame 160 equipped with multiple guiding means 162 and system backplane receptacles 165.

FIG. 20 is the cross section view 20—20 of FIG. 18 which shows the internal construction of the loaded external case frame 160. The sliding means 12c of the enclosure case 120 engages and removably slides into the guiding means 162 of the external case frame 160 through the case opening 161 when mounting the enclosure case 120 to the external case frame 160 whereby the enclosure case 120 can easily be mounted to or removed from the external case frame 160.

FIG. 17 to FIG. 20 clearly show that 4 enclosure cases with 24 modules are mounted inside the enclosure case 160. Heat dissipation may become a serious problem if it is not been properly treated. Heat dissipation design in this system is done by two methods: heat sink and air ventilation.

The heat sink design in FIG. 6 can be used to conduct heat from the top and bottom ends of each module mounted in an enclosure case 120 to the upper and lower case assemblies. And each enclosure case 120 can pass part of the heat to the external case frame 160 through the metallic guiding means 162. The external case frame 160 with all the enclosure cases 120 becomes a big heat sink which can conduct heat evenly out of each module, and then air ventilation will carry the heat out of each enclosure case through air. Air ventilation inside the loaded external case frame 160 in FIG. 20 is done in a vertical manner. Air will flow upward through each loaded enclosure case 120 by passing through the air ventilation holes installed on the upper and lower case assemblies, and also through the gaps between neighboring modules mounted inside an enclosure case 120. Please refer to FIG. 12 to FIG. 14 about the detail construction. Air ventilation holes are also built on the top side and the bottom side (not shown) of the external case frame 160 as part of the air ventilation design. If electrical fans are needed, they should be installed on the top side of the external case frame 160 to blow hot air out of the external case frame 160 and also force more cool air enter the external case frame 160 from the bottom air ventilation holes. The front, left and right sides of the external case frame 160 are used for I/O connections and these three sides plus the rear side of the external case frame 160 are basically airtight so that hot air generated from each enclosure case 120 can be effectively carried out vertically. High power electronic modules or subsystems such as power supply or CPU module which generate a lot of heat should be put close to the upper end of the external case frame 160 so that hot air generated from such components can be quickly blown out of the external case frame by the electrical fans installed on the top. If such components are put on the lower part of the external case frame 160, its hot air might affect all the enclosure cases 120 mounted above it. The heat conductance design coupled with the air cooling design provide very effective heat dissipation capability to the external case frame 160.

Figures 21A, 21B:
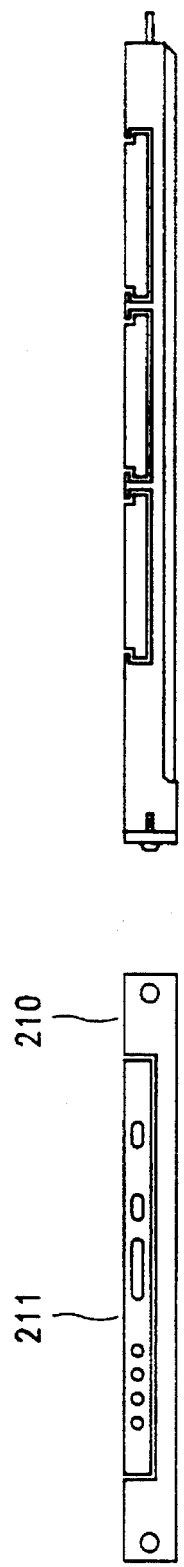
FIGS. 21A–21B are the front and side views of a lower case assembly which does not use upper case assembly.
Figure 24:
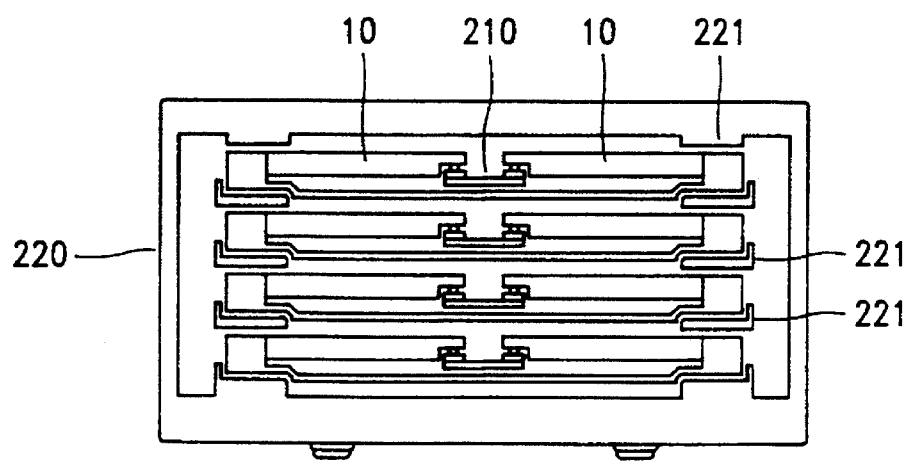
FIG. 24 is the cross section view 24—24 of FIG. 23 which shows the internal construction of the loaded external case frame.

The enclosure case 120 mounted in the external case frame 160 comprises both the upper and lower case assemblies. But it is not necessary to include a upper case assembly in an enclosure case, and this has been explained in FIGS. 4A–4C. FIGS. 21A–21B to FIG. 24 present a new enclosure case and external case frame design which uses only the lower case assembly for module mounting.

FIGS. 21A–21B show the front and side views of a lower case assembly 210 which does not use upper case assembly. The mounting design of the lower case assembly 210 inside the external case frame 220 will be illustrated from FIG. 22 to FIG. 24. FIGS. 21A–21B show that the lower case assembly 210 comprises a backplane assembly 211 with six module assemblies 10 loaded in it. The internal construction of the lower case assembly is similar to the lower case assembly 122 shown in FIG. 13.

Figure 22:
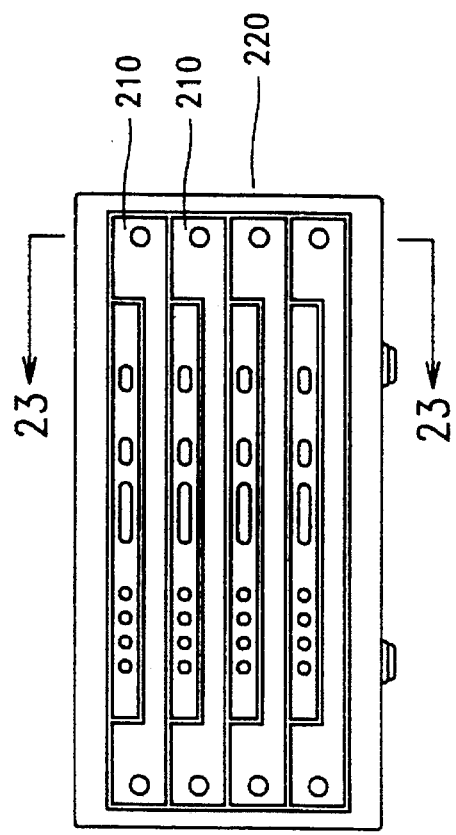
FIG. 22 is the front view of an external case frame loaded with four lower case assemblies.
Figure 23:
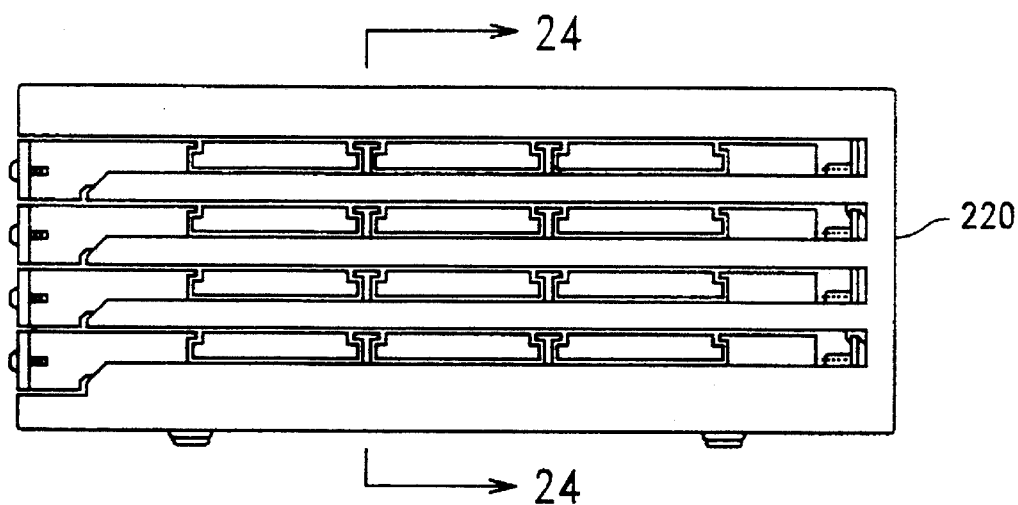
FIG. 23 is the side section view 23—23 of FIG. 22 which shows the loaded external case frame with no side panel installed.

FIG. 22 is the front view of the external case frame 220 loaded with four lower case assemblies 210 and FIG. 23 is the side section view 23—23 of FIG. 22 which shows the loaded external case frame 220 with no side panel installed. FIG. 24 is the cross section view 24—24 of FIG. 23 which shows the internal construction of the loaded external case frame 220.

FIG. 24 clearly shows that when a lower case assembly 210 is mounted inside the external case frame 220, the sliding means 221 of the external case frame 220 will hold the upper end of the module assemblies 10 so that the rear end of the module assembly 10 will not be moved. Such module clamping design does not need upper case assembly and thus make the enclosure case and also the external case frame more compact, when compared with the cross section view of the loaded external case frame 160 in FIG. 20. But an enclosure case with upper case assembly can provide two functions which can not be provided by the enclosure case 210. First, the upper case assembly will hold the front ends of the module assemblies mounted inside the enclosure case so that the connections between the module connectors and the backplane receptacles will always be maintained even in a harsh environment. Second, a upper case assembly can be used as a heat sink to dissipate heat from the upper ends of the module assemblies mounted inside.

All the above enclosure case designs require at least one lower case assembly for module mounting because the U-shaped holding means is installed on the lower case assembly. With some minor modifications over the module design shown in FIG. 1A–1C, the U-shaped holding means can be directly installed on a backplane assembly and the lower case assembly can further be eliminated. FIGS. 25A to FIG. 27C present such a new module and backplane design.

Figure 25A:
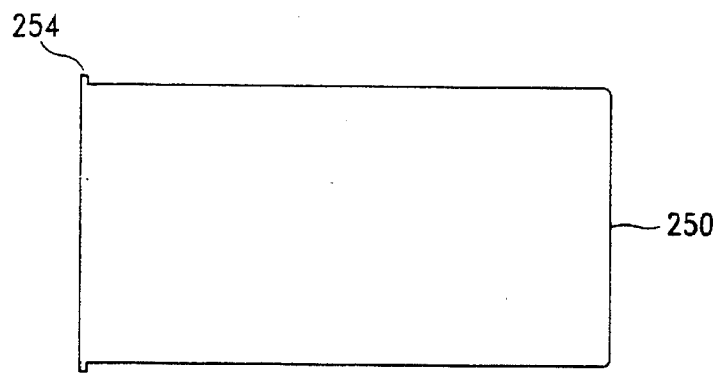
FIGS. 25A–25C are the top, side and front views of a module assembly which has a module connector installed on the bottom of the module assembly.
Figure 25B:
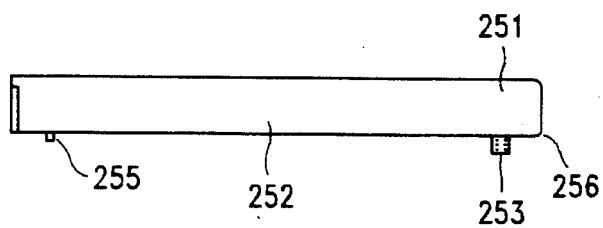
Figure 25C:
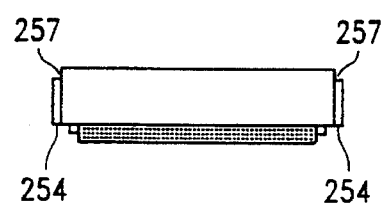

FIGS. 25A–25C are the top, side and front views of a module assembly 250 which has a module connector installed on the bottom of the module assembly. The electronic module assembly 250 comprises a module head 251 in its front end and a substantially rectangular module body 252 behind the module head 251. The module head 251 comprises a module connector 253 on its bottom and a front protruding edge 256 on its front end for module removal. The rear end of the module body 252 further comprises two protruding edges 254 on its left- and right-hand sides and a bottom protruding edge 255 on its bottom side. Each of the two protruding edges 254 of the module body 252 comprises a latching means 257 for preventing the rear end of the module body 252 from moving upward.

Figure 26A:
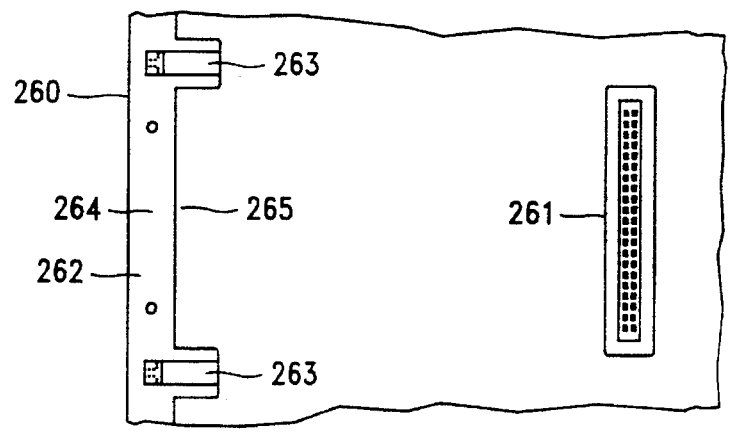
FIGS. 26A–26C are the top, side and rear views of an electronic backplane assembly according to the present invention.
Figure 26C:
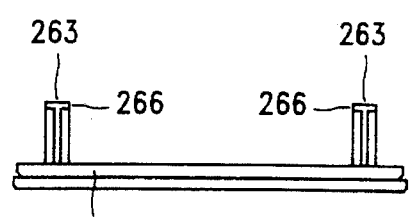
Figure 26B:
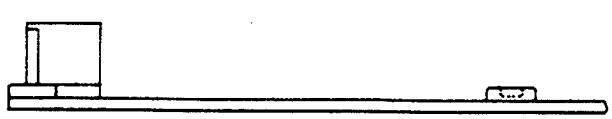

FIGS. 26A–26C are the top, side and rear views of an electronic backplane assembly 260 according to the present invention. The electronic backplane assembly 260 comprises a receptacle 261 for module head connection and a U-shaped holding means 262 for mounting the rear end of the module assembly 250. The U-shaped holding means 262 comprises two vertical planner panels 263 on its left- and right-hand sides and a bottom panel 264 with a receiving edge 265 on it. Each of the two vertical planner panels 263 of the U-shaped holding means 262 comprises a latch receiving means 266 which will prevent the rear end of the module body 252 from moving upward.

Figure 27A:
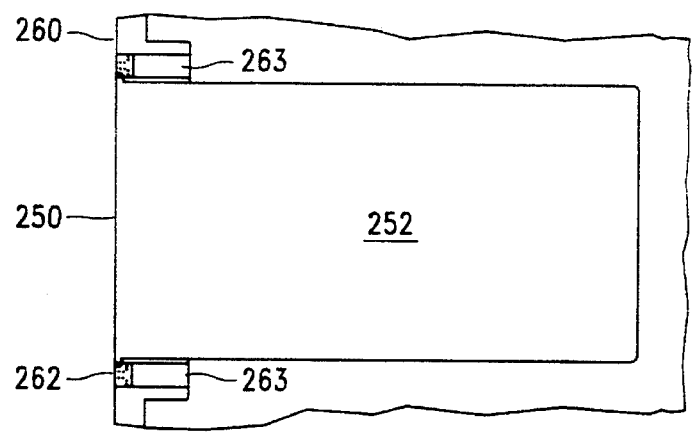
FIGS. 27A–27C are the top, side and rear view of the module assembly mounted to the backplane assembly.
Figure 27C:
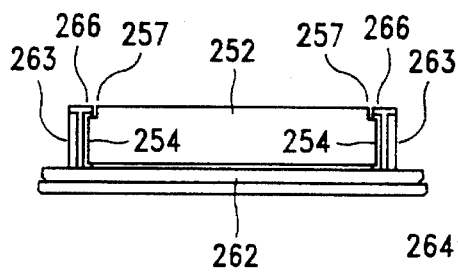
Figure 27B:
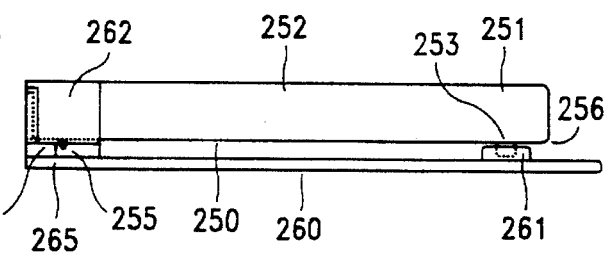

FIGS. 27A–27C are the top, side and rear view of the module assembly 250 mounted to the backplane assembly 260. It shows that the module connector 253 of the module head 251 is vertically plugged in and latched to the receptacle 261 of the backplane assembly 260 in a removable manner, and the rear end of the module body 252 engages and removably attaches to the U-shaped holding means 262 of the backplane assembly 260 whereby the module assembly 250 is reliably mounted to the backplane assembly 260 by front end latching and rear end holding. The module assembly 250 can be removed from the backplane assembly 260 by pulling the front protruding edge 256 up to detach the module connector 253 of the module head 251 from the receptacle 261 of the backplane assembly 260 first and then pulling the module head 251 backward to remove the rear end of the module body 252 from the U-shaped holding means 262 of the backplane assembly 260, just like the module removal shown in FIG. 7. The left- and right-hand sides of the rear end of the module body 252 engage and removably attach to the two vertical planner panels 263 of the U-shaped holding means 262 whereby the rear end of the module body 252 is reliably held by the U-shaped holding means 262. The two protruding edges 254 of the module body 252 engage and inwardly attach to the rear ends of the two vertical planner panels 263 of the U-shaped holding means 262 to resist external pushing forces exerted on the rear end of the module body 252. The latching means 257 of the two protruding edges 254 engage and removably latch the latch receiving means 266 of the two vertical planner panels 263 to prevent the rear end of the module body 252 from moving upward after the module body 252 is mounted to the U-shaped holding means 262. The bottom protruding edge 255 of the module body 252 engages and outwardly attaches to the receiving edge 265 of the bottom panel 264 to resist external pulling forces exerted on the rear end of the module body 252. A complete backplane assembly 260 can take several module assemblies 250 on it just like the lower case assembly shown in FIGS. 21A–21B, and be mounted in an external case frame (not shown) with guiding means for such backplane assemblies.

Installing a U-shaped holding means directly to a backplane assembly allows a system designer to put the module assembly almost in any location in a backplane assembly as long as the space is available. Such module mounting design is very similar to traditional daughterboards but different in the mounting mechanism. Traditional daughterboards usually use module connectors and/or screws as the mounting mechanism. Screw mounting is always difficult to work with by hands, and the module installation/removal operations, plus some I/O cable connections to such daughterboards, always put a lot of stress over the module connectors and the screw mounting mechanisms. Such stress is very damaging and usually cause some reliability problems or make such modules unsuitable for repeated operations. Such problems can totally be solved by the U-shaped holding means design. The U-shaped holding means is used as the main supporting structure for the module mounted on it, and the front end connector functions just like a "key" to lock or unlock the whole module assembly to a backplane assembly. When a module is mounted to a backplane, the U-shaped holding means will hold the module body tightly to resist any force exerted from either a harsh environment, or from possible I/O connections over the rear end of the module. The module connector will totally be shielded by the U-shaped holding means for such forces. Besides, module installation or removal operations exert very little stress on the module connector and this can be seen in FIG. 7. Such mounting mechanism not only make the module design more reliable, but is also much easier to work with.

Figure 28A:
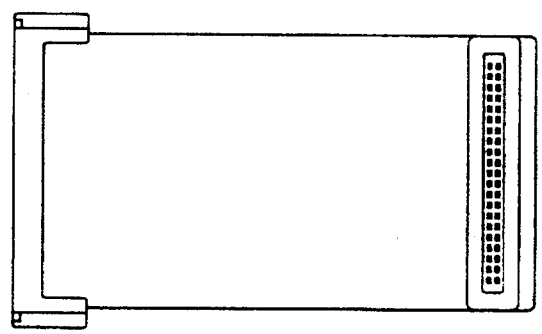
FIGS. 28A–28C are the top, side and rear view of a module assembly with a receptacle and a U-shaped holding means on its top for mounting anther module assembly.
Figure 28C:
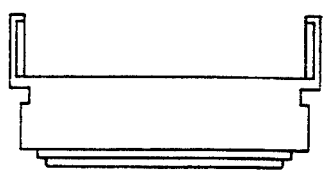
Figure 28B:
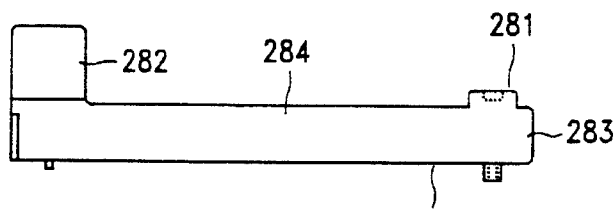

The module mounting design shown in FIGS. 27A–27C can easily be modified to allow multiple modules stacking on top of the module assembly 250. FIGS. 28A–28C present such an example. FIGS. 28A–28C are the top, side and rear view of a module assembly 280 with a receptacle 281 and a U-shaped holding means 282 on its top for mounting another module assembly. The module assembly 280 comprises a receptacle 281 on top of its module head 283 and a U-shaped holding means 282 on top of the rear end of the module body 284 for mounting another module assembly.

FIGS. 29A–29B are the side and rear views of two module assemblies stacked together on the backplane assembly 260. It shows that a module assembly 250 is stacked on top of the module assembly 280. One or more module assemblies can be stacked on top of the module assembly 280 in the same manner.

Both the module designs shown in FIGS. 1A–1C and FIGS. 25A–25C can only be vertically mounted to a lower case assembly or a backplane assembly, and then the loaded lower case assembly or backplane assembly will be mounted to an external case frame. A compact server using either of such module designs does not allow direct module installation externally. That means the loaded lower case assembly or backplane assembly must be pulled out from the external case frame first, and then a module can be installed or removed. Such installation process will make other modules mounted in the same lower case assembly or backplane assembly inoperable throughout the installation process. In some specific server applications such as network or telecommunication servers, such interruption over other unrelated modules is not allowed. A module used in such applications must be directly swapped externally without causing interruption to other modules. FIGS. 30A–30C and FIGS. 31A–31C present a new module and module guide assembly design which is similar to the module assembly 10 and the lower case assembly 30 shown in FIGS. 4A–4C but with a horizontal connector in the new module's front end, and also a guiding means on the module guide assembly for horizontal module installation.

FIGS. 30A–30C are the front, side, and bottom views of a module assembly 300 with a horizontal module connector 302 on its front end. The electronic module assembly 300 comprises a substantially rectangular module body 301, a module connector 302 on the front end of the module body 301, a sliding means 303 on the left- and right-hand sides of the module body 301, a latch receiving means 304 installed on the bottom of the module body which is a hole, and two protruding edges 305 on the left- and right-hand sides of the rear end of the module body 301.

Figure 31A:
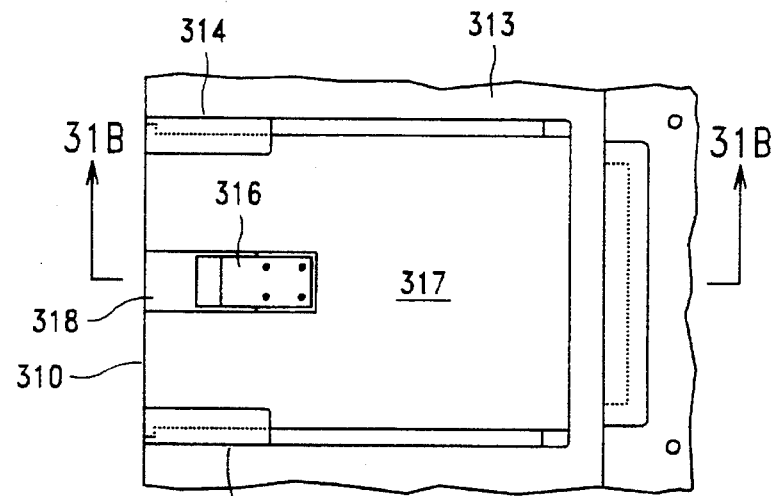
FIGS. 31A–31C are the top view, side section view 31B—31B of the top view, and rear view of a module guide assembly according to the present invention.
Figure 31C:
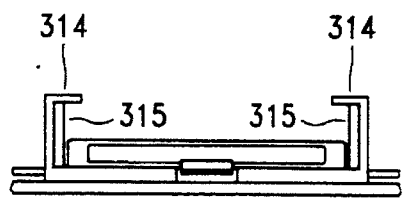
Figure 31B:
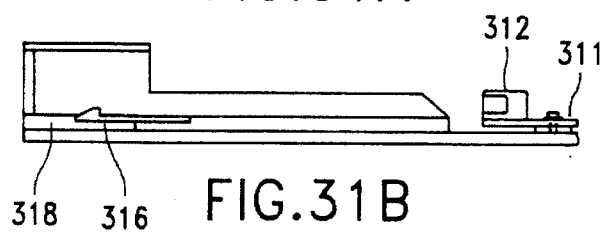

FIGS. 31A–31C are the top view, side section view 31B—31B of the top view, and rear view of a module guide assembly 310 according to the present invention. The module guide assembly 310 comprises an electronic backplane assembly 311 having at least one receptacle 312 for connecting the module connector 302 of the module assembly 300 horizontally, a lower panel 313 for mounting the backplane assembly 311 wherein the backplane assembly 311 is removably mounted to the lower panel 313 of the module guide assembly 310 for module connection, and a guiding means 314 for guiding the movement of the module body 301 in forward and backward directions. The guiding means is installed on the lower panel 313 of the module guide assembly 310. The guiding means 314 of the module guide assembly 310 further comprises two vertical edges 315 on the rear end of the guiding means 314 for engaging the protruding edges 305 of the module assembly 300, and also a latching means 316 which is a flexible hooking means installed on the lower panel 317 of the guiding means for latching the latch receiving means 304 of the module assembly 310. The module guide assembly 310 further comprises a unlatching channel 318 located between the latching means 316 and the rear end of the module guide assembly 310 which will allow the module unlatching means 330 to unlatch the latching means 316 and this will be explained in FIG. 34.

Figure 32A:
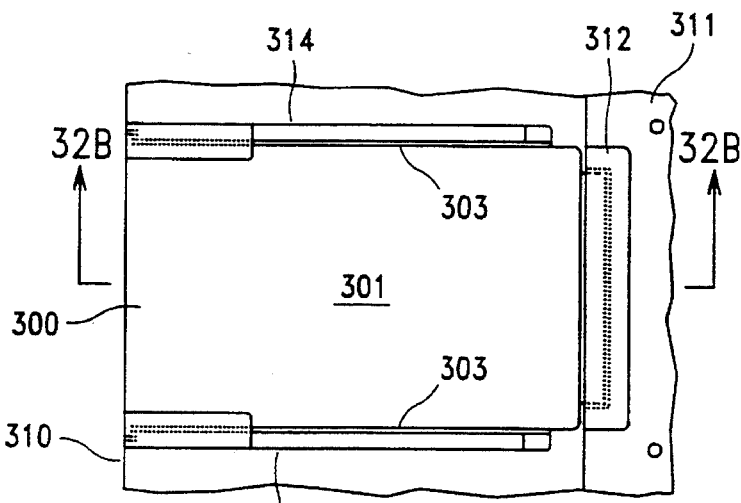
FIGS. 32A–32C are the top view, side section view 32B—32B of the top guide assembly; view, and rear view of the module assembly mounted to the module
Figure 32C:
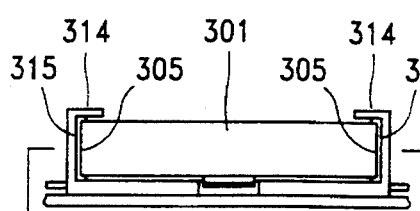
Figure 32B:
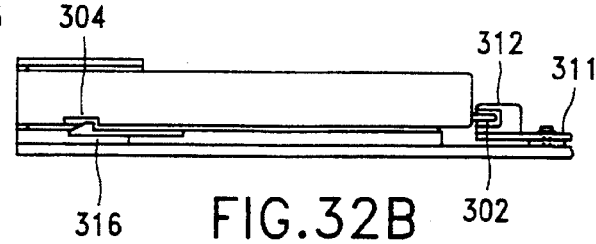

FIGS. 32A–32C are the top view, side section view 32B—32B of the top view, and rear view of the module assembly 300 mounted to the module guide assembly 310. The guiding means 314 engages and removably guides the sliding means 303 of the module body 301 horizontally toward the receptacle 312 of the backplane assembly 311 when mounting the module assembly 300 to the module guide assembly 310 and the module connector 302 of the module assembly 300 is horizontally plugged into the receptacle 312 of the backplane assembly 311 after the module assembly 300 is mounted to the module guide assembly 310. The two protruding edges 305 of the module body 301 engage and inwardly attach to the two vertical edges 315 of the guiding means 314 to resist external pushing forces exerted on the rear end of the module body 301. The latching means 316 of the guiding means 314 of the module guide assembly 310 engages and removably latches the latch receiving means 304 of the module assembly 300 to prevent it from sliding backward after the module assembly 300 is mounted to the module guide assembly 310. The latching means 316 of the module guide assembly 310 is a flexible hooking means and the latch receiving means 304 of the module assembly 300 is a hole on the bottom side of the module body 301 wherein the hooking means 316 of the module guide assembly 310 engages and removably hooks the hole 304 of the module assembly 300 to prevent it from moving backward after the module assembly 300 is mounted to the module guide assembly 310. A complete module guide assembly 310 can take several module assemblies 300 on it just like the lower case assembly shown in FIGS. 21A–21B, and be mounted to the same external case frame 220.

The module latching mechanism 304 and 316 shown in FIGS. 32A–32C is embedded under the module assembly 300 and it requires a module unlatching means to unlock it and pull the module assembly out of the module guide assembly 310. The module unlatching means is illustrated in FIGS. 33A–33C. FIGS. 33A–33C are the front, side, and bottom views of a module unlatching means 330 according to the present invention. The module unlatching means comprises a front edge 331 for unlatching the latching means 316 of the module guide assembly 310, a latching means 332 for module removal, and a protruding edge 333 on its body to prevent the module unlatching means from moving too far into the unlatching channel 318.

FIG. 34 shows that the module unlatching means 330 has unlatched the latching means 316 of the module guide assembly 310 and is ready to pull the module assembly 300 out. It shows that the module unlatching means 330 is inserted into the rear opening of the unlatching channel 318 to unlatch the connection between the latching means 316 of the module guide assembly 310 and the latch receiving means 304 of the module assembly 300. In the unlatching process the front edge 331 of the module unlatching means 330 will press down the flexible hooking means 316 of the module guide assembly 310, and in the same time the flexible hooking means 316 will push the front end of the module unlatching means 330 upward so that the latching means 332 of the module unlatching means 330 will engage with the latch receiving means 304 of the module assembly 300. The latching means 332 of the module unlatching means 330 engages and removably latches the latch receiving means 304 of the module assembly 300 after the latching means 316 of the module guide assembly 310 is unlatched from the latch receiving means 304 of the module assembly 300 by the module unlatching means 330 whereby the module assembly 300 can be pulled out from the guiding means 314 of the module guide assembly 310 by using the module unlatching means 330. The protruding edge 333 of the module unlatching means 330 will engage the edge of the rear opening of the unlatching channel 318 if the module unlatching means 330 is moved too far into the unlatching channel 318 of the module guide assembly 310. FIG. 35 shows that the module assembly 300 has been partially pulled out from the module guide assembly 310 by using the module unlatching means 330.

The module unlatching means 330 is a key-like device which can be used as a security feature to prevent unauthorized removal of the module assembly 300 after it is mounted to a module guide assembly 310. But it also may cause problem if someone loses it. An alternative design of the module latching mechanism may solve this problem. The latching means 316 of the module guide assembly 310 and the latch receiving means 304 of the module assembly 300 can be moved close to the rear end of the module guide assembly 310 so that a screw driver or any device with a sharp blade can be used to unlatch it directly from outside. A user may use a screw driver to unlatch the latching means 316 and also stick to the latch receiving means 304 of the module assembly 300 to push it out for about 4 to 5 mm, and then hold the two protruding edges 305 of the module assembly 300 by hand and pull it out.

FIG. 36 is the cross section view 36—36 of the rear view in FIGS. 32A–32C which shows the rear part of the module body 301 mounted to the module guide assembly 310 which has two elastic means 360. Each of the two vertical edges 315 on the rear end of the guiding means 314 further comprises an elastic means 360 on its surface wherein the two protruding edges 305 of the module body 301 engage and inwardly attach to the elastic means 360 of the two vertical edges 315 of the guiding means 314 whereby external pushing forces exerted on the rear end of the module body 301 can partially be absorbed by the elastic means 360.

Figure 37:
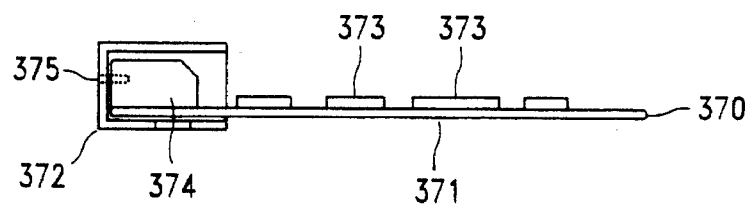
FIG. 37 is the side section view of a PCB module which shows the internal construction of the PCB module.

FIG. 37 is the side section view of a PCB module which shows the internal construction of the PCB module 370. The PCB module 370 comprises a PCB board 371 and a tail cap 372. The PCB board 371 comprises a plurality of electronic components 373 installed on its upper end and an I/O port 374 on its rear end. The tail cap is fastened to the I/O port 374 by screws 375. The module assemblies 10, 250 or 300 can be either an electronic module with a substantially rectangular enclosure case around it or a substantially rectangular PCB stack with at least one tail cap on its rear end. The PCB stack can have one or more PCB boards stacking together. If the PCB stack comprises more than one PCB board, a shoulder cap (not shown) which is similar to the tail cap 372 shown in FIG. 37 can be used to hold the front end of the PCB stack.

Figure 38A:
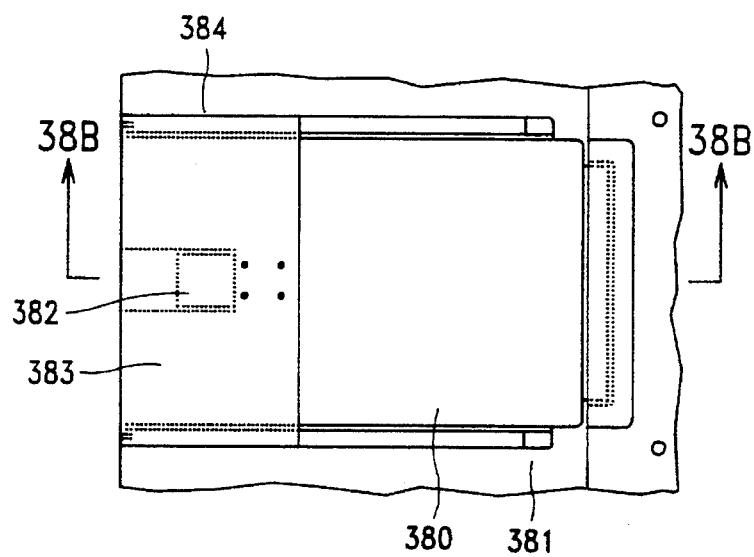
FIGS. 38A–38C are the top view, side section view 38B—38B of the top view, and rear view of a module assembly mounted to a module guide assembly which has a latching means installed on its top.
Figure 38C:
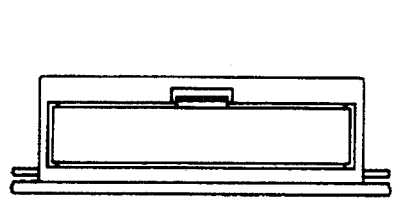
Figure 38B:
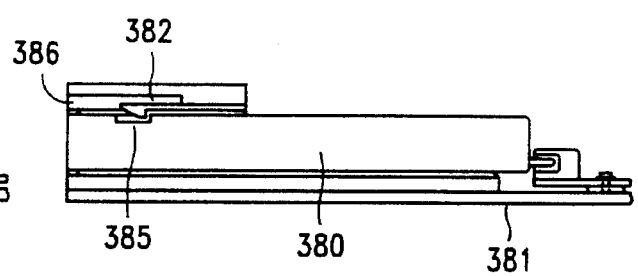

The module latching mechanism presented in FIGS. 30A–30C and FIGS. 31A–31C is installed under the module body 301, but it is possible to put the module latching mechanism on top of the module body. This will be illustrated in FIGS. 38A–38C and FIG. 39. FIGS. 38A–38C are the top view, side section view 38B—38B of the top view, and rear view of a module assembly 380 mounted to a module guide assembly 381 which has a latching means 382 installed on its top.

It shows that the latching means 382 is installed on the upper panel 383 of the guiding means 384 and a correspondent latch receiving means 385 installed on top of the module assembly 380 wherein the latching means 382 of the guiding means 384 of the module guide assembly 381 engages and removably latches the latch receiving means 385 of the module assembly 380 to prevent it from sliding backward after the module assembly 380 is mounted to the module guide assembly 381. The latching means 382 of the module guide assembly 381 is a flexible hooking means and the latch receiving means 385 of the module assembly 380 is a hole on the module body wherein the hooking means 382 of the module guide assembly 381 engages and removably hooks the hole 385 of the module assembly 380 to prevent it from moving backward after the module assembly 380 is mounted to the module guide assembly 381. The module guide assembly 381 further comprises a unlatching channel 386 located between the latching means 382 and the rear end of the module guide assembly 381 for module unlatching.

Figure 39:
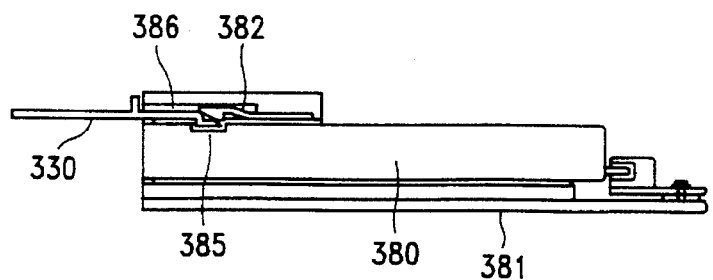
FIG. 39 is a side section view which shows that the module unlatching means has unlatched the latching means of the module guide assembly shown in FIG. 38 and is ready to pull the module assembly out.

FIG. 39 shows that the module unlatching means 330 has unlatched the latching means 382 of the module guide assembly 381 and is ready to pull the module assembly 380 out, The module unlatching means 330 is inserted into the rear opening of the unlatching channel 386 to unlatch the connection between the latching means 382 of the module guide assembly 381 and the latch receiving means 385 of the module assembly 380. The latching means 332 of the module unlatching means 330 engages and removably latches the latch receiving means 385 of the module assembly 380 after the latching means 382 of the module guide assembly 381 is unlatched from the latch receiving means 385 of the module assembly 380 by the module unlatching means 330 whereby the module assembly 380 can be pulled out from the guiding means 384 of the module guide assembly 381 by using the module unlatching means 330, The above disclosure is not intended as limiting. Those skilled in the art will readily observe that numerous modifications and alterations of the device may be made while retaining the teachings of the invention, Accordingly, the above disclosure should be construed as limited only by the metes and bounds of the appended claims,

I claim:

1. A modularized electronic system for packaging and assembling a plurality of electronic modules comprising:

(1) an enclosure case having at least one lower case assembly with a lower horizontal panel in it for module loading; the lower panel of the lower case assembly comprises at least one U-shaped holding means having two vertical planner panels on its left- and right-hand sides;

(2) an electronic backplane assembly having at least one receptacle and the backplane assembly is removably mounted to the lower case assembly for module connection;

(3) at least one electronic module assembly having a module head in its front end and a substantially rectangular module body behind the module head; the module head comprises a module connector on its bottom wherein the module connector of the module head is vertically plugged in and latched to the receptacle of the backplane assembly in a removable manner, and the left- and right-hand sides of the rear end of the module body engage and removably attach to the two vertical planner panels of the U-shaped holding means of the lower case assembly whereby the module assembly is reliably mounted to the lower case assembly by having its front end mounted to the receptacle of the backplane assembly and its rear end mounted to the U-shaped holding means;

the rear end of the module body further comprises a latching means and the rear end of the U-shaped holding means further comprises a correspondent latch receiving means wherein the latching means of the module body engages and removably attaches to the latch receiving means of the U-shaped holding means to prevent the rear end of the module body from moving upward after the module assembly is mounted to the lower case assembly.

2. The modularized electronic system of claim 1 wherein:

the lower case assembly further comprises a heat sink mounted on the lower panel and the lower case assembly comprises heat conductive material in its case body for heat conductance wherein the heat sink of the lower case assembly engages and removably attaches to the lower end of the module assembly whereby the lower case assembly can be used as a heat sink to dissipate heat generated from the module assembly.

3. The modularized electronic system of claim 1 wherein:

the lower case assembly further comprises a plurality of air ventilation openings on the lower panel whereby air ventilation can be created inside the enclosure case through the air ventilation openings.

4. The modularized electronic system of claim 1 wherein:

the enclosure case further comprises a upper case assembly having a upper horizontal panel for module clamping; the upper case assembly comprises an assembly attachment means and the lower case assembly further comprises an assembly attachment means wherein the assembly attachment means of the upper case assembly engages and removably attaches to the assembly attachment means of the lower case assembly; the upper panel of the upper case assembly engages and removably attaches to the upper end of the module assembly when the enclosure case is closed whereby the module assembly is more reliably mounted to the lower case assembly by the help of the upper case assembly.

5. The modularized electronic system of claim 4 wherein:

the upper panel of the upper case assembly further comprises at least one cushion means on the module contacting part for vibration absorption and shock protection purposes whereby the module assembly can be protected by the cushion means of the upper case assembly in a harsh environment.

6. The modularized electronic system of claim 4 wherein:

the module assembly comprises a base module assembly on its lower end and at least one mounting kit assembly attached on top of the base module assembly wherein a base module can easily be mounted in a higher enclosure case by attaching a mounting kit assembly on its top.

7. The modularized electronic system of claim 4 wherein:

the upper case assembly further comprises a heat sink mounted under the upper panel and the upper case assembly comprises heat conductive material in its case body for heat conductance wherein the heat sink of the upper case assembly engages and removably attaches to the upper end of the module assembly whereby the upper case assembly can be used as a heat sink to dissipate heat generated from the module assembly.

8. The modularized electronic system of claim 4 wherein:

the upper case assembly further comprises a plurality of air ventilation openings on the upper panel whereby air ventilation can be created inside the enclosure case through the air ventilation openings.

9. The modularized electronic system of claim 1 wherein:

the modularized electronic system further comprises an external case frame having at least one case opening on its front side and a guiding means along the left- and right-hand sides of the case opening for housing the enclosure case; the enclosure case comprises a substantially rectangular case body with a sliding means on two opposite sides of the case body wherein the sliding means of the enclosure case engages and removably slides into the guiding means of the external case frame through the case opening when mounting the enclosure case to the external case frame whereby the enclosure case can easily be mounted to or removed from the external case frame.

10. The modularized electronic system of claim 9 wherein:

the external case frame further comprises a case latching means on the left- and right-hand sides of the case opening and the enclosure case further comprises a latch receiving means on two correspondent sides of the case body wherein the latch receiving means of the enclosure case engages and removably latches the case latching means of the external case frame after the enclosure case is mounted to the external case frame to prevent it from sliding out of the case opening.

11. The modularized electronic system of claim 9 wherein:

the external case frame further comprises a system backplane having at least one receptacle and the system backplane is removably mounted to the inner side of the case opening; the backplane assembly of the lower case assembly of the enclosure case further comprises a backplane connector wherein the backplane connector of the enclosure case engages and horizontally attaches to the receptacle of the system backplane of the external case frame after the enclosure case is mounted to the external case frame whereby a plurality of the enclosure cases can be horizontally mounted to an external case frame equipped with multiple guiding means and system backplane receptacles.

12. The modularized electronic system of claim 1 wherein:

the U-shaped holding means of the lower panel is made as a removable assembly having an assembly attachment means and the lower panel of the lower case assembly further comprises a correspondent assembly attachment means wherein the assembly attachment means of the U-shaped holding means engages and securely attaches to the assembly attachment means of the lower panel whereby the U-shaped holding means of the lower panel can be changed without hard tooling modification to the lower case assembly.

13. The modularized electronic system of claim 1 wherein:

at least one of the two vertical planner panels of the U-shaped holding means is made as a removable assembly having an assembly attachment means and the lower panel of the lower case assembly further comprises a correspondent assembly attachment means wherein the assembly attachment means of the vertical planner panel engages and removably attaches to the assembly attachment means of the lower panel whereby the vertical planner panel can easily be changed.

14. The modularized electronic system of claim 1 wherein:

the module assembly further comprises a front protruding edge on its front end for module removal wherein the module assembly can be removed from the lower case assembly by pulling the front protruding edge up to detach the module connector of the module head from the receptacle of the backplane assembly first and then pulling the module head backward to remove the rear end of the module body from the U-shaped holding means of the lower case assembly.

15. The modularized electronic system of claim 1 wherein:

the rear end of the module body further comprises two protruding edges on its left and right sides wherein the two protruding edges of the module body engage and inwardly attach to the rear ends of the two vertical planner panels of the U-shaped holding means to resist external pushing forces exerted on the rear end of the module body.

16. The modularized electronic system of claim 15 wherein:

the latching means on the rear end of the module body for preventing the rear end of the module body from moving upward is installed on the two protruding edges of the module body and the correspondent latch receiving means of the U-shaped holding means is installed on the rear ends of the two vertical planner panels wherein the latching means of the module body engages and removably attaches to the latch receiving means of the U-shaped holding means after the module assembly is mounted to the lower case assembly whereby the rear end of the module body is reliably latched to the lower case assembly for possible I/O connecting operations over the rear end of the module body.

17. The modularized electronic system of claim 1 wherein:

the rear end of the module body further comprises a bottom protruding edge on its bottom side and the U-shaped holding means of the lower case assembly further comprises a bottom panel with a receiving edge on it wherein the bottom protruding edge of the module body engages and outwardly attaches to the receiving edge of the bottom panel to resist external pulling forces exerted on the rear end of the module body.

18. The modularized electronic system of claim 1 wherein:

the lower panel of the lower case assembly further comprises at least one cushion means under the backplane assembly for vibration absorption and shock protection purposes whereby the backplane assembly and the module assembly can be protected by the cushion means of the lower case assembly in a harsh environment.

19. The modularized electronic system of claim 1 wherein:

the module connector of the module head is positioned higher than the bottom of the module body wherein the module connector will not be touched when the module assembly is placed on a planner surface outside the modularized electronic system whereby the module connector can easily be kept clean and avoid possible damage.

20. A modularized electronic system for packaging and assembling a plurality of electronic modules comprising:

(1) at least one electronic module assembly having a module head in its front end and a substantially rectangular module body behind the module head; the module head comprises a module connector on its bottom;

(2) an electronic backplane assembly having (a) at least one receptacle for module head connection and (b) a U-shaped holding means for mounting the rear end of the module assembly wherein the module connector of the module head is vertically plugged in and latched to the receptacle of the backplane assembly in a removable manner, and the rear end of the module body engages and removably attaches to the U-shaped holding means of the backplane assembly whereby the module assembly is reliably mounted to the backplane assembly by front end latching and rear end holding.

21. The modularized electronic system of claim 20 wherein:

the module assembly further comprises a front protruding edge on its front end for module removal wherein the module assembly can be removed from the backplane assembly by pulling the front protruding edge up to detach the module connector of the module head from the receptacle of the backplane assembly first and then pulling the module head backward to remove the rear end of the module body from the U-shaped holding means of the backplane assembly.

22. The modularized electronic system of claim 20 wherein:

the U-shaped holding means of the backplane assembly comprises two vertical planner panels on its left- and right-hand sides wherein the left- and right-hand sides of the rear end of the module body engage and removably attach to the two vertical planner panels of the U-shaped holding means whereby the rear end of the module body is reliably held by the U-shaped holding means.

23. The modularized electronic system of claim 22 wherein:

the rear end of the module body further comprises two protruding edges on its left- and right-hand sides wherein the two protruding edges of the module body engage and inwardly attach to the rear ends of the two vertical planner panels of the U-shaped holding means to resist external pushing forces exerted on the rear end of the module body.

24. The modularized electronic system of claim 23 wherein:

each of the two protruding edges of the module body further comprises a latching means and each of the two vertical planner panels of the U-shaped holding means further comprises a correspondent latch receiving means wherein the latching means of the two protruding edges engage and removably latch the latch receiving means of the two vertical planner panels to prevent the rear end of the module body from moving upward after the module body is mounted to the U-shaped holding means.

25. The modularized electronic system of claim 20 wherein:

the rear end of the module body further comprises a bottom protruding edge on its bottom side and the U-shaped holding means of the backplane assembly further comprises a bottom panel with a receiving edge on it wherein the bottom protruding edge of the module body engages and outwardly attaches to the receiving edge of the bottom panel to resist external pulling forces exerted on the rear end of the module body.

26. The modularized electronic system of claim 20 wherein:

the module assembly further comprises a receptacle on top of its module head and a U-shaped holding means on top of the rear end of the module body for mounting another module assembly whereby one or more module assemblies can be stacked on top of the module assembly in the same manner.

27. A modularized electronic system for packaging and assembling a plurality of electronic modules comprising:
(1) at least one electronic module assembly having
  (a) a substantially rectangular module body,
  (b) a module connector on the front end of the module body,
  (c) a sliding means on the left- and right-hand sides of the module body and
  (d) two protruding edges on the left- and right-hand sides of the rear end of the module body;
(2) an electronic backplane assembly having at least one receptacle for connecting the module connector horizontally;
(3) a module guide assembly comprising
  (a) a lower panel for mounting the backplane assembly wherein the backplane assembly is removably mounted to the lower panel of the module guide assembly for module connection;
  (b) a guiding means for guiding the movement of the module body in forward and backward directions wherein the guiding means is installed on the lower panel of the module guide assembly, and the guiding means engages and removably guides the sliding means of the module body horizontally toward the receptacle of the backplane assembly when mounting the module assembly to the module guide assembly and the module connector of the module assembly is horizontally plugged into the receptacle of the backplane assembly after the module assembly is mounted to the module guide assembly; the guiding means of the module guide assembly further comprises two vertical edges on the rear end of the guiding means wherein the two protruding edges of the module body engage and inwardly attach to the two vertical edges of the guiding means to resist external pushing forces exerted on the rear end of the module body;
(4) a module latching mechanism selected from the group consisting of
  (a) a latching means installed on the lower panel of the guiding means and a correspondent latch receiving means installed on the bottom of the module body and
  (b) a latching means installed on the upper panel of the guiding means and a correspondent latch receiving means installed on the top of the module body
wherein the latching means of the guiding means of the module guide assembly engages and removably latches the latch receiving means of the module assembly to prevent it from sliding backward after the module assembly is mounted to the module guide assembly.

28. The modularized electronic system of claim 27 wherein:

the latching means of the module guide assembly is a flexible hooking means and the latch receiving means of the module assembly is a hole on the module body wherein the hooking means of the module guide assembly engages and removably hooks the hole of the module assembly to prevent it from moving backward after the module assembly is mounted to the module guide assembly.

29. The modularized electronic system of claim 27 wherein:

each of the two vertical edges on the rear end of the guiding means further comprises an elastic means on its surface wherein the two protruding edges of the module body engage and inwardly attach to the elastic means of the two vertical edges of the guiding means whereby external pushing forces exerted on the rear end of the module body can partially be absorbed by the elastic means.

30. The modularized electronic system of claim 27 wherein:

the modularized electronic system further comprises a module unlatching means for module unlatching and the module guide assembly further comprises a unlatching channel located between the latching means and the rear end of the module guide assembly wherein the module unlatching means can be inserted into the rear opening of the unlatching channel to unlatch the connection between the latching means of the module guide assembly and the latch receiving means of the module assembly.

31. The modularized electronic system of claim 30 wherein:

the module unlatching means further comprises a latching means for module removal wherein the latching means of the module unlatching means engages and removably latches the latch receiving means of the module assembly after the latching means of the module guide assembly is unlatched from the latch receiving means of the module assembly by the module unlatching means whereby the module assembly can be pulled out from the guiding means of the module guide assembly by using the module unlatching means.

32. The modularized electronic system of claim 30 wherein:

the module unlatching means further comprises a protruding edge on its body to prevent the module unlatching means from moving too far into the unlatching channel wherein the protruding edge of the module unlatching means will engage the edge of the rear opening of the unlatching channel if the module unlatching means is moved too far into the unlatching channel of the module guide assembly.

* * * * *